(12) United States Patent
Fujisawa

(10) Patent No.: US 8,811,105 B2
(45) Date of Patent: Aug. 19, 2014

(54) INFORMATION PROCESSING SYSTEM INCLUDING SEMICONDUCTOR DEVICE HAVING SELF-REFRESH MODE

(75) Inventor: Hiroki Fujisawa, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 96 days.

(21) Appl. No.: 13/559,244

(22) Filed: Jul. 26, 2012

(65) Prior Publication Data

US 2013/0028037 A1     Jan. 31, 2013

(30) Foreign Application Priority Data

Jul. 28, 2011   (JP) ................. 2011-165711

(51) Int. Cl.
  *G11C 7/00*     (2006.01)
  *G11C 11/406*   (2006.01)
(52) U.S. Cl.
  CPC ................. *G11C 11/406* (2013.01)
  USPC ........... 365/222; 365/189.04; 365/233.11; 365/233.1; 365/233.12
(58) Field of Classification Search
  CPC ........... G11C 11/406; G11C 11/40615; G11C 11/40618; G11C 2211/4061; G11C 2211/4065

USPC ........ 365/222, 189.04, 233.11, 233.1, 233.12
See application file for complete search history.

(56) References Cited

U.S. PATENT DOCUMENTS

| | | | |
|---|---|---|---|
| 6,373,303 B2 | 4/2002 | Akita | |
| 2001/0043097 A1 | 11/2001 | Akita | |
| 2007/0206431 A1* | 9/2007 | Matsuzaki | .................. 365/222 |
| 2011/0058437 A1 | 3/2011 | Miyano | |

FOREIGN PATENT DOCUMENTS

| | | |
|---|---|---|
| JP | 2001-332086 A | 11/2001 |
| JP | 2011-061457 A | 3/2011 |

* cited by examiner

*Primary Examiner* — Thong Q Le
(74) *Attorney, Agent, or Firm* — McGinn IP Law Group, PLLC

(57) ABSTRACT

Disclosed herein is a semiconductor device having first and second operation modes. In the first operation mode, the semiconductor device deactivates a DLL circuit during a self-refresh mode. In the second operation mode, the semiconductor device intermittently activates the DLL circuit to generate an internal clock signal.

20 Claims, 21 Drawing Sheets

| SYMBOL | CKE PRIOR CYCLE | CKE CURRENT CYCLE | CSB | FASB | CASB | WEB |
|---|---|---|---|---|---|---|
| REF | H | H | L | L | L | H |
| SRE | H | L | L | L | L | H |
| SRX | L | H | H | — | — | — |
| PDE | H | L | L | H | H | H |
| PDX | L | H | H | — | — | — |

FIG.4

| DIMM401 | | DIMM402 | |
|---|---|---|---|
| RANK1 | RANK2 | RANK1 | RANK2 |
| 120 Ω | ODT off | ODT off | 30 Ω |

FIG.22A

| DIMM401 | | DIMM402 | |
|---|---|---|---|
| RANK1 | RANK2 | RANK1 | RANK2 |
| ODT off | 30 Ω | 120 Ω | ODT off |

FIG.22B

| DIMM401 | | DIMM402 | |
|---|---|---|---|
| RANK1 | RANK2 | RANK1 | RANK2 |
| ODT off | ODT off | ODT off | 30 Ω |

FIG.22C

| DIMM401 | | DIMM402 | |
|---|---|---|---|
| RANK1 | RANK2 | RANK1 | RANK2 |
| ODT off | 30 Ω | ODT off | ODT off |

FIG.22D

INFORMATION PROCESSING SYSTEM INCLUDING SEMICONDUCTOR DEVICE HAVING SELF-REFRESH MODE

BACKGROUND OF THE INVENTION

1. Field of the Invention

The present invention relates to an information processing system and a control method thereof, and more particularly to an information processing system including a semiconductor device with a self-refresh mode and a control method thereof. The present invention also relates to a control method of a controller, and more particularly to a controller that controls a semiconductor device with a self-refresh mode and a control method thereof.

2. Description of Related Art

In a semiconductor device that performs an operation in synchronism with a clock signal such as asynchronous DRAM (Dynamic Random Access Memory), an internal clock signal phase-controlled is often required inside of the semiconductor device. The phase-controlled internal clock signal is mainly generated by a DLL (Delay Locked Loop) circuit included in the semiconductor device (see Japanese Patent Application Laid-open No. 2011-61457). The DLL circuit includes a delay line that delays the internal clock signal and a delay amount thereof is determined based on a count value output from a counter circuit. The counter circuit is controlled by a phase control circuit having a comparing unit that compares phases of an external clock signal supplied from outside and the internal clock signal. Because the DLL circuit is a circuit block that consumes a relatively large amount of power, the semiconductor device described in Japanese Patent Application Laid-open No. 2011-61457 reduces power consumption by intermittently performing a phase control operation.

Meanwhile, an operation mode called a self-refresh mode is provided for the DRAM. The self-refresh mode is a kind of standby mode in which refresh of storage data included in storage cells is periodically performed inside of the DRAM asynchronously with outside. A controller can stop issuance of many external signals such as an external clock signal and a command signal to be supplied to the semiconductor device, during a period when the semiconductor device has entered the self-refresh mode. During the period when the semiconductor device has entered the self-refresh mode, an input first-stage circuit such as a clock receiver included in the DRAM to receive a signal supplied from outside is inactivated and operations of circuit blocks such as the DLL circuit are also stopped. Accordingly, when the semiconductor device has entered the self-refresh mode, entire power consumption of the system becomes quite low. Furthermore, the refresh operation is periodically performed inside of the DRAM, so that the storage data are not lost.

However, because the operation of the DLL circuit stops during the period when the semiconductor device has entered the self-refresh mode, it takes a long time for the DLL circuit to be locked again (for example, to set a delay amount reset in the DLL circuit to match phases of the external clock signal and the internal clock signal with each other) after the semiconductor device exits the self-refresh mode. This means delay of a command issued by the controller after the exit. This means, for example, that a long time is required after the semiconductor device exits the self-refresh mode and before input of a command requiring a phase-controlled internal clock signal becomes possible.

To solve this problem, a method that enables to intermittently activates an DLL circuit also during a period when a semiconductor device has entered a self-refresh mode is proposed in Japanese Patent Application Laid-open No. 2001-332086. Although such an operation does not comply with DRAM standards, a time required after the semiconductor device exits from the self-refresh mode and before the DLL circuit is locked again can be greatly reduced by performing this operation.

However, in the DRAM described in Japanese Patent Application Laid-open No. 2001-332086, a clock receiver included in the DRAM needs to be activated in the same manner as in a normal mode other than the self-refresh mode to enable the operation of the DLL circuit even in the self-refresh mode. Accordingly, even when the semiconductor device has entered the self-refresh mode, power consumption of the clock receiver cannot be reduced. That is, the method according to Japanese Patent Application Laid-open No. 2001-332086 enables to reduce the lock time after the exit; however, low power consumption, which is superiority of the self-refresh, is sacrificed. Therefore, reduction in the lock time after the exit while maintaining merits of the self-refresh is demanded.

This problem occurs not only in the DRAM but also in all semiconductor devices with the self-refresh mode. For example, there is the same problem also in a semiconductor device that in a part includes nonvolatile memory cells having a problem of cell data retention.

SUMMARY

In one embodiment, there is provided a semiconductor device that includes: a first input buffer circuit to which an external clock signal having a predetermined frequency is supplied from outside; a DLL circuit that generates an internal clock signal that is phase-controlled based on an output signal from the first input buffer circuit; a memory cell array that has a plurality of memory cells requiring an refresh operation in order to retain of storage data therein; an output buffer circuit that outputs the storage data read from the memory cell array to outside through a data terminal synchronously with the internal clock signal; and an access control circuit. The access control circuit performs an access operation to the memory cell array in response to a first command, outputs the storage data from the data terminal or controls an impedance of the data terminal synchronously with the external clock signal or the internal clock signal in response to a second command, enters a self-refresh mode in which the refresh operation on the storage data is periodically performed asynchronously with the external clock signal in response to a self-refresh command, exits the self-refresh mode in response to a self-refresh exit command, and intermittently activates the first input buffer circuit and the DLL circuit in conjunction with each other during the self-refresh mode.

In another embodiment, there is provided a controller that includes: a clock signal issuing unit that issues a clock signal having a predetermined frequency; and a command issuing unit that issues at least a self-refresh command that causes a semiconductor device to enter a self-refresh mode in which a refresh operation of storage data is periodically performed asynchronously with the clock signal. When the controller is in a first operation mode, the clock signal issuing unit stops issuing the clock signal or changes a frequency thereof in at least a part of period while the semiconductor device is in the self-refresh mode. When the controller is in a second operation mode, the clock signal issuing unit continuously issues the clock signal without changing the frequency while the semiconductor device is in the self-refresh mode.

In still another embodiment, there is provided an information processing system that includes: a first device including a memory cell array that holds storage data, an input buffer circuit to which an external clock signal having a predetermined frequency is supplied, and a DLL circuit that generates an internal clock signal that is phase-controlled based on the external clock signal, the first device having a self-refresh mode in which a refresh operation of the storage data is periodically performed asynchronously with the external clock signal; and a second device issuing the external clock signal, a self-refresh command that causes the first device to enter the self-refresh mode, and a self-refresh exit command that causes the first device to exit the self-refresh mode. The second device continuously issues the external clock signal to the first device while the first device is in the self-refresh mode. The first device intermittently activates the input buffer circuit and the DLL circuit in conjunction with each other while the first device is in the self-refresh mode.

In still another embodiment, there is provided a control method of an information processing system having a controller and a semiconductor device. The method including: setting the semiconductor device to a first or second operation mode; issuing a clock signal having a predetermined frequency to the semiconductor device; issuing a self-refresh command to the semiconductor device; stopping the clock signal or changes the predetermined frequency thereof after issuing the self-refresh command when the semiconductor device is in the first operation mode; and continuously issuing the clock signal with the predetermined frequency regardless of whether the self-refresh command is issued when the semiconductor device is in the second operation mode. The method further including: receiving the synchronization signal; entering a self-refresh mode in response to the self-refresh command to periodically perform an refresh operation on storage data asynchronously with the clock signal while the semiconductor device is in the self-refresh mode; inactivating, in the first operation mode, a DLL circuit that generates an internal clock signal that is phase-controlled based on the clock signal in response to the self-refresh command and resetting information related to a delay amount of the DLL circuit; and intermittently activating, in the second operation mode, the DLL circuit and maintaining the information updated at each activation in response to the self-refresh command.

In still another embodiment, there is provided a control method of a controller, the method including: issuing a clock signal having a predetermined frequency; setting a semiconductor device to a first or a second operation mode, the semiconductor device having a self-refresh mode in which a refresh operation of storage data is automatically performed; issuing a self-refresh command that causes the semiconductor device to enter the self-refresh mode; stopping the clock signal or changing the predetermined frequency thereof after issuing the self-refresh command when the semiconductor device is in the first operation mode; and continuously issuing the clock signal without changing the predetermined frequency regardless of whether the self-refresh command has been issued when the semiconductor device is in the second operation mode.

According to the semiconductor device of the present invention, the input buffer circuit and the DLL circuit are activated intermittently in conjunction with each other during a period when the semiconductor device has entered the self-refresh mode. Therefore, power consumption of the input buffer circuit during the self-refresh mode can be reduced.

According to the controller and the control method thereof of the present invention, the semiconductor device can be set to the first or second operation mode. Therefore, a most appropriate system corresponding to the first or second operation can be constructed while an operation complying with the standards can be performed.

According to the information processing system and the control method thereof of the present invention, the input buffer circuit and the DLL circuit are activated intermittently in conjunction with each other during a period when the semiconductor device has entered the self-refresh mode. Therefore, power consumption of the input buffer circuit during the self-refresh mode can be reduced.

BRIEF DESCRIPTION OF THE DRAWINGS

FIG. 4 is a list of commands indicated by command signals CMD and a clock enable signal CKE;

FIGS. 22A to 22D are tables for explaining impedance controls for respective ranks, in which FIG. 22A shows a case where a write operation is performed for the DIMM 401, FIG. 22B shows a case where a write operation is performed for the DIMM 402, FIG. 22C shows a case where a read operation is performed for the DIMM 401, and FIG. 22D shows a case where a read operation is performed for the DIMM 402.

DETAILED DESCRIPTION OF THE EMBODIMENTS

A representative embodiment of the present invention is described below. It is needless to mention that the contents that the present application is to claim for patent are not limited to the following embodiment, but to the description of the appended claims. That is, the embodiment of the present invention is that an external synchronization signal is continuously issued from a controller to a semiconductor device regardless of whether the semiconductor device has entered a self-refresh mode and that, on the side of the semiconductor device, an input buffer circuit to which the external synchronization signal is input and a DLL circuit are activated intermittently in conjunction with each other during a period when the semiconductor device has entered the self-refresh mode. This enables a state of the DLL circuit to be updated intermittently and be kept in a state where an internal synchronization signal correctly phase-controlled can be obtained, even in the self-refresh mode. Therefore, an information processing system can reduce power consumption of the input buffer circuit during the self-refresh mode, and the controller can issue a command requiring the phase-controlled internal synchronization signal in a short time after the semiconductor device exits the self-refresh mode.

Figure 1:
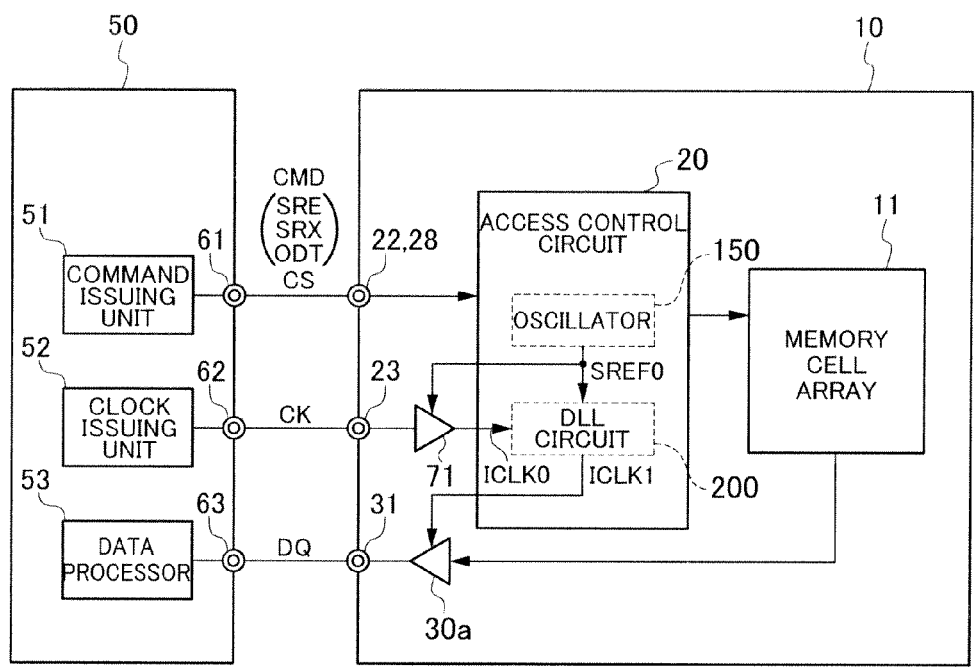
FIG. 1 is a schematic diagram for explaining an embodiment of the present invention.

Referring now to FIG. 1, it shows an information processing system including a controller 50 and a semiconductor device 10. The semiconductor device 10 includes a command terminal 22, a clock terminal 23, and a data terminal 31, which are connected to a command terminal 61, a clock terminal 62, and a data terminal 63 included in the controller 50, respectively. The command terminal 22 includes a chip select terminal 28 which will be explained later. The controller 50 includes a command issuing unit 51 that issues a command CMD, a clock issuing unit 52 that issues an external clock signal CK, and a data processor 53 that processes storage data DQ. The command terminal 22 includes a plurality of control pins (not shown), and plural commands (first and second commands, for example), which will be explained later, are defined by corresponding logical combinations of plural control signals. In the present invention, an external clock signal having a predetermined frequency is also referred to as "synchronization signal" or "external synchronization signal". The controller 50 does not need to be configured with one chip and, for example, the clock issuing unit 52 and the other units can be configured with separate chips.

The semiconductor device 10 includes a memory cell array 11 that holds storage data, an input buffer circuit 71 to which the external clock signal CK is supplied, an output buffer circuit 30a that outputs the storage data read from the memory cell array 11 synchronously with an internal clock signal ICLK1, and an access control circuit 20 that performs an access to the memory cell array 11. The access control circuit 20 includes a DLL circuit 200 and an oscillator 150. The DLL circuit 200 generates the internal clock signal ICLK1 phase-controlled, based on the external clock signal CK.

The oscillator 150 periodically generates a refresh signal SREF0 during a self-refresh mode. Timings when the refresh signal SREF0 is generated are asynchronous with the external clock signal CK and therefore a refresh operation is performed asynchronously with the external clock signal CK when the semiconductor device has entered the self-refresh mode.

The command CMD issued by the controller 50 includes a self-refresh command SRE for entering the self-refresh mode, a self-refresh exit command SRX for exiting the self-refresh mode and the like, in addition to a row command and a column command.

Figure 2:
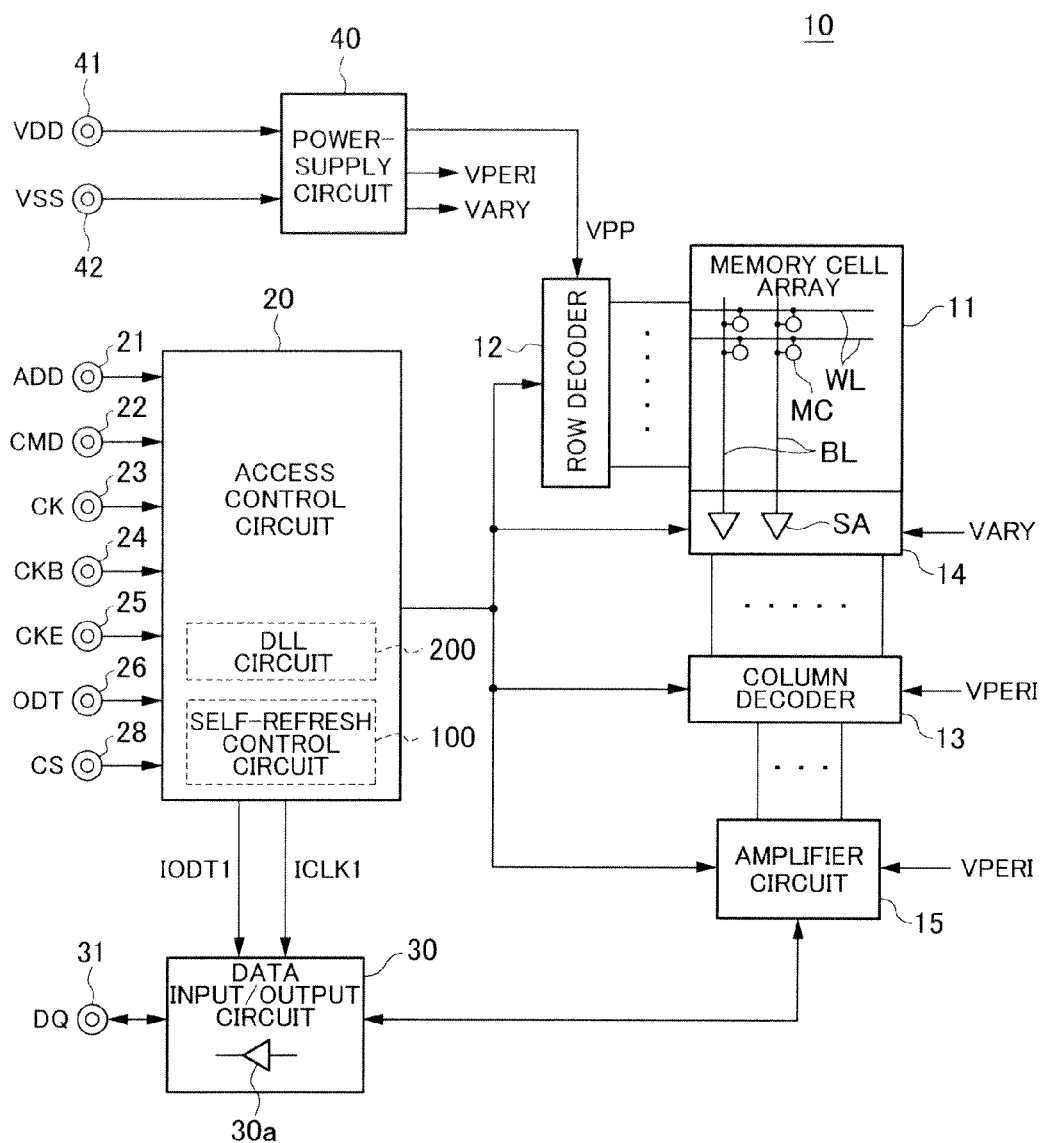
FIG. 2 is a block diagram indicative of an embodiment of a general configuration of a semiconductor device 10 according to a first embodiment of the present invention.

The row command causes the access control circuit 20 to perform an access to the memory cell array 11 based on a row address and corresponds to an active command ACT, an auto-refresh command REF and the like. In the present invention, these commands are also referred to as "first commands". On the other hand, the column command causes the access control circuit 20 to control a state of the data terminal 31 based on a column address and corresponds to a read command RD, a write command WT and the like. As shown in FIG. 2 explained later, when the read command RD is issued, data in an amplifier circuit 15 is output to outside through the data terminal 31. When the write command WT is issued, data supplied from outside is supplied to the amplifier circuit 15 through the data terminal 31. Although not relevant to the column address, an impedance control signal ODT used by the access control circuit 20 to control an impedance of the data terminal 31 also belongs to the column command. Among these commands, the read command RD and the impedance control signal ODT are commands for controlling a state of the data terminal 31 synchronously with the internal clock signal ICLK1 and these commands are also referred to as "second commands" in the present invention.

The information processing system shown in FIG. 1 has first and second operation modes. The first operation mode is compliant with DRAM standards (JEDEC (Joint Electron Device Engineering Council) Solid State Technology Association), and the second operation is different from the DRAM standards. In either case where the information processing system is set to the first or second operation mode, the semiconductor device 10 enters the self-refresh mode when the self-refresh command SRE is issued from the controller 50 to the semiconductor device 10 and exits the self-refresh mode when the self-refresh exit command SRX is issued. However, operations performed by the controller 50 and the semiconductor device 10 during the self-refresh mode differ between the first and second operation modes.

In the case where the first operation mode is set, the controller 50 stops an operation of the clock issuing unit when the semiconductor device 10 has entered the self-refresh mode. Stop indicates that the external clock signal CK is kept in a high or low state and does not oscillate, or has a high impedance. Accordingly, issuance of the external clock signal CK is stopped and the external clock signal CK is not supplied to the semiconductor device 10. In association therewith, the input buffer circuit 71 and the DLL circuit 200 are inactivated and power consumption is reduced.

On the other hand, in the case where the second operation is set, the controller 50 causes the clock issuing unit 52 to continue the operation even when the semiconductor device 10 has entered the self-refresh mode. Accordingly, the issuance of the external clock signal CK is continued and the external clock signal CK is continuously supplied to the semiconductor device 10. However, the input buffer circuit 71 of the semiconductor device 10 is not always activated during the self-refresh mode but activated in conjunction with the DLL circuit 200 intermittently activated. Specifically, the input buffer circuit 71 is activated in response to the refresh signal SREF0, which causes an internal clock signal ICLK0 to be intermittently supplied to the DLL circuit 200. Also the DLL circuit 200 is intermittently activated in response to the refresh signal SREF0. In this way, when the second operation mode is set, the DLL circuit 200 is kept in a state where the phase-controlled internal clock signal ICLK1 can be output immediately even during a period when the semiconductor device 10 has entered the self-refresh mode. Therefore, even after the semiconductor device 10 has exited the self-refresh mode, the second command that uses the internal clock signal ICLK1 can be issued in a short time.

Preferred embodiments of the present invention will be explained below in detail with reference to the accompanying drawings.

Turning to FIG. 2, the semiconductor device 10 according to the present embodiment is a DRAM and includes the memory cell array 11. The semiconductor device 10 is mainly constituted by an N-channel transistor and a P-channel transistor. In the memory cell array 11, a plurality of word lines WL and a plurality of bit lines BL intersecting with each other are provided and a plurality of memory cells MC are arranged at intersections thereof, respectively. Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA. As explained later, the memory cell array 11 is divided into eight banks.

Operations of the row decoder 12, the column decoder 13, the sense circuit 14, and the amplifier circuit 15 are controlled by the access control circuit 20. An address signal ADD, the command signal CMD, external clock signals CK and CKE, a clock enable signal CKE, the impedance control signal ODT, and a chip select signal CS are supplied to the access control circuit 20. These signals are input from outside through corresponding terminals 21 to 26 and 28. The external clock signals CK and CKB are synchronization signals complementary to each other. The chip select signal CS is used by the controller 50 to select the semiconductor device (the access control circuit 20). The access control circuit 20 controls the row decoder 12, the column decoder 13, the sense circuit 14, the amplifier circuit 15, and a data input/output circuit 30 based on these signals.

Specifically, when the command signal CMD indicates the active command ACT, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing. This operation is also referred to as "access to storage data" and a command for performing this operation is also referred to as "first command".

When the command signal CMD indicates the read command RD or the write command WT, the address signal ADD is supplied to the column decoder 13. In response thereto, the column decoder 13 connects a bit line BL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MO through the amplifier circuit and the sense amplifier SA. This operation is also referred to as "output of storage data" and a command for performing this operation is also referred to as "second command".

When the command signal CMD indicates the auto-refresh command REF, the access control circuit 20 supplies a count value (refresh address) of a refresh counter (not shown) to the row decoder 12. In response thereto, the row decoder 12 selects a word line WL indicated by the refresh address and accordingly memory cells MC connected to the selected word line WL are refreshed by the sense amplifiers SA. This operation is also referred to as "access to storage data" and a command for performing this operation is also referred to as "first command".

Furthermore, when the command signal CMD indicates the self-refresh command SRE, a self-refresh control circuit 100 included in the access control circuit 20 starts to cause the semiconductor device 10 to enter the self-refresh mode. Details of refresh in the self-refresh mode are equivalent to those in the case of the auto-refresh command. When the command signal CMD indicates the self-refresh exit command SRX, the semiconductor device 10 exits the self-refresh mode. While the auto refresh and the self refresh of the present application are the same in that both refresh the storage data, they are different in power consumption or specifications of interface during the refresh. The consumption current in the self refresh is lower than that in the auto refresh. In the semiconductor device, more clock buffers (input buffer circuits) that communicate with outside can be inactivated at the time of self refresh, so that power of internal circuits not related to the refresh in the semiconductor device can be controlled to be smallest. From the viewpoint of interface, impedance controls of the data terminal that outputs data are different, for example. In principle, the impedance control cannot be performed at the time of self refresh while it is possible at the time of auto refresh.

As shown in FIG. 2, the access control circuit 20 includes the DLL circuit 200. The DLL circuit 200 receives the external clock signals CK and CKB and generates the internal clock signal ICLK1 phase-controlled, based on the received signal. The DLL circuit 200 includes a delay circuit (corresponding to reference numeral 210 in FIG. 6) that delays the external clock signals CK and CKB, a delay adjusting circuit (corresponding to 220 and 250 in FIG. 6) that adjusts a delay amount of the delay circuit, and a phase comparing circuit (corresponding to 240 in FIG. 6) that compares phases of the internal clock signal ICLK1 output from the delay circuit and the external clock signals CK and CKB, and supplies a result of the comparison to the delay circuit. The internal clock signal ICLK1 is supplied to the output buffer circuit 30a included in the data input/output circuit 30 and accordingly read data DQ that are read from the memory cell array 11 are output from the data terminal 31 synchronously with the internal clock signal ICLK1. An impedance control signal IODT1 is also supplied to the data input/output circuit 30. When the impedance control signal IODT1 is activated, the output buffer circuit 30a is brought into a predetermined state and accordingly the data terminal 31 is controlled to have a predetermined impedance. This operation is also referred to as "control of an impedance of the data terminal" and a command for performing this operation is also referred to as "second command".

These circuit blocks use predetermined internal voltages as operating power. These internal voltages are generated by a power-supply circuit 40 shown in FIG. 2. The power-supply circuit 40 receives an external potential VDD and a ground potential VSS supplied through power-supply terminals 41 and 42, respectively, and generates internal voltages VPP, VPERI, VARY and the like based on these potentials. The internal voltage VPP is generated by increasing the external potential VDD and the internal voltages VPERI and VARY are generated by decreasing the external potential VDD. The power-supply circuit 40 also generates a negative voltage (not shown).

The internal voltage VPP is mainly used by the row decoder 12. The row decoder 12 drives a word line WL selected based on the address signal ADD to a VPP level, thereby bringing cell transistors included in the memory cells MC into conduction. The internal voltage VARY is mainly used by the sense circuit 14. When activated, the sense circuit 14 drives one of paired bit lines to a VARY level and the other bit line to a VSS level, thereby amplifying read data that have been read. The internal voltage VPERI is used as an operating voltage for most of peripheral circuits such as the access control circuit 20. Power consumption of the semiconductor device 10 is reduced by using the internal voltage VPERI lower than the external voltage VDD as the operating voltage for these peripheral circuits.

Figure 3:
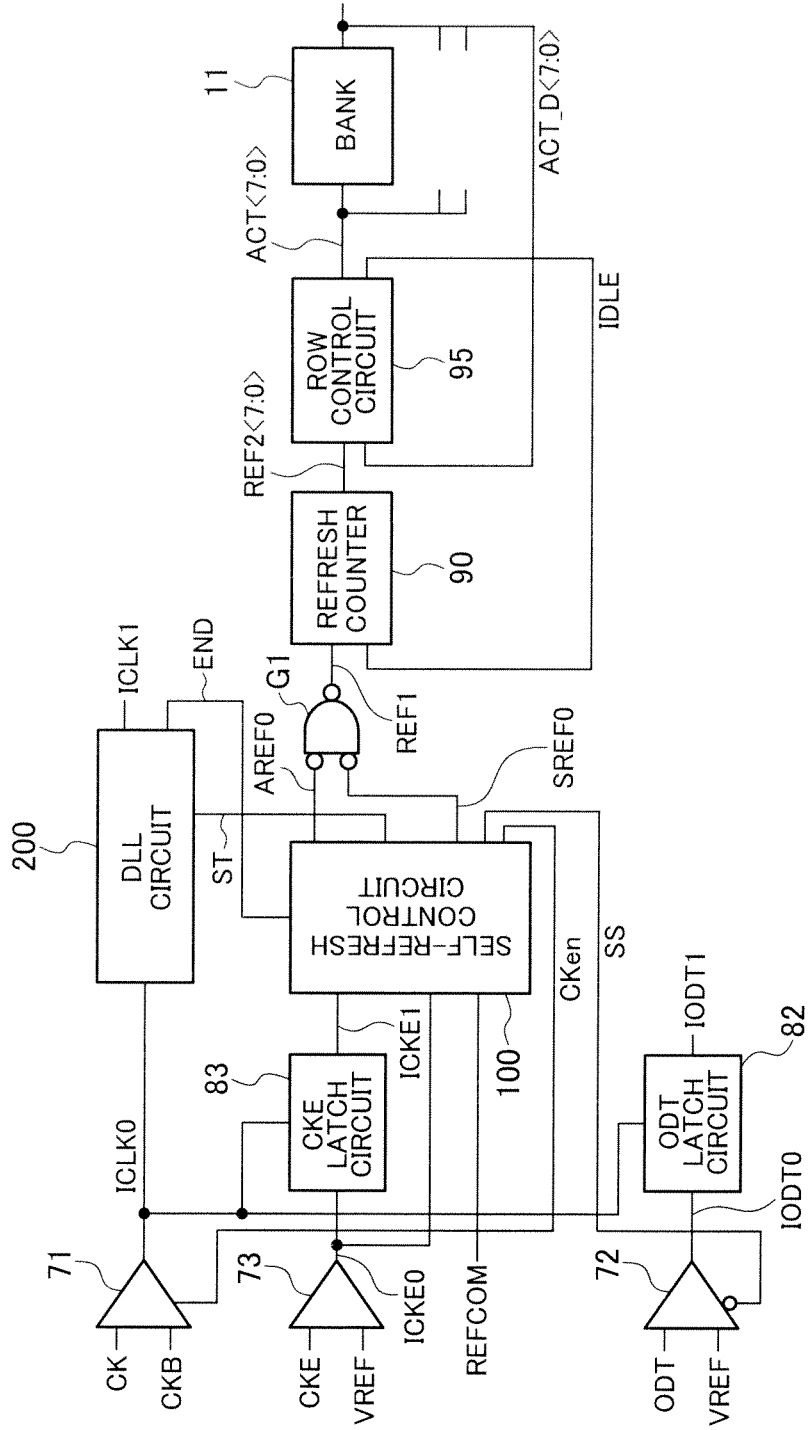
FIG. 3 is a block diagram indicative of an embodiment of main circuit blocks included in an access control circuit 20 and shows a first embodiment of the present invention.

Turning to FIG. 3, the access control circuit 20 includes input buffer circuits 71 to 73. The input buffer circuit 71 receives the external clock signals CK and CKB and generates the internal clock signal ICLK0, and is also referred to as "first input buffer circuit" in the present invention. The input buffer circuit 72 receives the impedance control signal ODT and generates an impedance control signal IODT0, and is also referred to as "second input buffer circuit" in the present invention. The input buffer circuit 73 receives the clock enable signal CKE and generates a clock enable signal ICKE0, and is also referred to as "third input buffer circuit" in the present invention. The input buffer circuits 71 and 72 are activated or inactivated according to an enable signal CKen and a self-state signal SS, respectively. The input buffer circuit 71 is activated when the enable signal CKen is high. The input buffer circuit 72 is activated when the self-state signal SS is low. On the other hand, the input buffer circuit 73 is always activated. This is because the self-refresh exit command SRX is indicated by the clock enable signal CKE and thus the input buffer circuit 73 needs to be activated also in the self-refresh mode. The self-refresh command SRE is indicated by the command CMD input through the command terminal 22 and the clock enable signal CKE input through the clock enable terminal 25.

Turning to FIG. 4, each command is represented by a combination of the command signals CMD and a logic level of the clock enable signal CKE. In FIG. 4, "H" denotes a high level, "L" denotes a low level, and "-" denotes "Don't care". Furthermore, "CSB", "RASB", "CASB", and "WEB" denote a chip select signal, a row-address strobe signal, a column-address strobe signal, and a write enable signal, respectively. These signals CSB, RASB, CASB, and WEB are signals constituting the command signals CMD.

Specifically, when the signals CSB, RASB, and CASB are set to a low level (L) and the signal WEB is set to a high level (H) with the clock enable signal CKE kept at a high level (H), this is handled as the auto-refresh command REF. When the clock enable signal CKE is changed from the high level (H) to a low level (L) with the signals CSB, RASB, and CASB set at the low level (L) and the signal WEB set at the high level (H), this is handled as the self-refresh command SRE. When the clock enable signal CKE is changed from the high level (H) to the low level (L) with the signal CSB set at the low level (L) and the signals RASB, CASB, and WEB set at the high level (H), this is handled as a power-down command PDE. When the clock enable signal CKE is changed from the low level (L) to the high level (H) with the signal CSB set at the high level (H), this is handled as the self-refresh exit command SRX or a power-down exit command PDX.

The internal clock signal ICLK0 output from the input buffer circuit 71 is supplied to the DLL circuit 200. The DLL circuit 200 generates the internal clock signal ICLK1 phase-controlled, based on the internal clock signal ICLK0. Operation states of the DLL circuit 200 include a first active state, a second active state, and an inactive state, details of which will be explained later.

The first active state is an operation state where the delay circuit, the delay adjusting circuit, and the phase comparing circuit are active and thus the internal clock signal ICLK1 phase-controlled is continuously generated, and the DLL circuit 200 is brought into this operation state when a read command and the impedance control signal ODT are issued. Therefore, the internal clock signal ICLK1 generated in the first active state is supplied to the output buffer circuit 30*a* shown in FIG. 2. The second active state is an operation state where the internal clock signal ICLK1 phase-controlled is generated at a predetermined time interval, and the delay circuit, the delay adjusting circuit, and the phase comparing circuit are activated at the predetermined time interval. This is an update operation of confirming phases of the internal clock signal ICLK1 and the external clock signals CK and CKB at the predetermined time interval to eliminate phase shifting due to temperature or voltage changes. Specifically, this is an operation of updating information of the delay amount provided by the delay adjusting circuit to the delay circuit at the predetermined time interval. Therefore, the internal clock signal ICLK1 generated in the second active state does not need to be supplied to the output buffer circuit 30*a* shown in FIG. 2. The inactive state is a state where the delay circuit, the delay adjusting circuit, and the phase comparing circuit are inactive and accordingly the internal clock signal ICLK1 is not generated. However, information of the counter circuit 220 that holds update information included in the delay adjusting circuit is held.

In the first embodiment, the DLL circuit 200 is intermittently brought into the second active state during the self-refresh mode. Transition from the inactive state to the second active state is triggered by an update start signal ST. When the update operation is completed, the DLL circuit 200 outputs an update end signal END.

The impedance control signal IOCDT0 supplied from the input buffer circuit 72 is latched by an ODT latch circuit 82. The ODT latch circuit 82 latches the impedance control signal IODT0 synchronously with the internal clock signal ICLK0, and the impedance control signal IODT1 output from the ODT latch circuit 82 is supplied to the data input/output circuit 30 shown in FIG. 2.

The clock enable signal ICKE0 output from the input buffer circuit 73 is latched by a CKE latch circuit 83. The CKE latch circuit 83 latches the clock enable signal ICKE0 synchronously with the internal clock signal ICLK0, and a clock enable signal ICKE1 output from the CKE latch circuit 83 is supplied to the self-refresh control circuit 100.

The self-refresh control circuit 100 is a circuit block that receives the clock enable signals ICKE0 and ICKE1, a refresh command REFCOM, and the update end signal END and generates various internal signals. The refresh command REFCOM is common to the auto-refresh command REF and the self-refresh command SRE included in the command signal CMD. The internal signals generated by the self-refresh control circuit 100 include an auto-refresh signal AREF0, the self-refresh signal SREF0, the enable signal CKen, the self-state signal SS, and the update start signal ST. A specific circuit configuration of the self-refresh control circuit 100 is explained later.

As shown in FIG. 3, the auto-refresh signal AREF0 and the self-refresh signal SREF0 are supplied to an OR gate circuit G1, and a refresh signal REF1 output therefrom is supplied to a refresh counter 90. The refresh counter 90 generates eight refresh signals REF2<7:0> with a small shift from each other eight consecutive times in a time sequence, respectively, in response to a plurality of toggles of the refresh signal REF1 and an idle signal IDLE. In the first embodiment, the memory cell array 11 is divided into eight banks and the refresh signals REF2<7:0> are used as refresh signals for corresponding banks <7:0>, respectively. That is, the idle signal IDLE is toggled seven times in response to one refresh signal REF1, so that each of the eight refresh signals REF2<7:0> is generated eight times in a row, thereby selecting 64 word lines.

The refresh signals REF2<7:0> are supplied to a row control circuit 95. The row control circuit 95 includes an address counter that has a refresh address stored therein and, when the refresh signals REF2<7:0> are activated, outputs the refresh address together with active signals ACT<7:0> to the corresponding banks <7:0>, respectively. When the active signals ACT<7:0> are activated, a word line indicated by the refresh address is accessed in the corresponding banks <7:0>, respectively. Delayed active signals ACT_D<7:0> are then fed back from the corresponding banks <7:0>, respectively, to the row control circuit 95, so that a next refresh address is supplied. The row control circuit 95 receives the delayed active signals ACT_D<7:0> and outputs the idle signal IDLE to the refresh counter 90. The refresh counter 90 increases a count value in response to the idle signal IDLE and generates the eight refresh signals REF2<7:0> again with a small shift with each other. Refresh of the banks <7:0> is performed by a staggered operation. This routine is repeated eight times. By repeating this operation a predetermined number of times (eight times, for example), eight word lines are selected in each of the banks <7:0> in a time sequence. In this way, a refresh operation for memory cells MC connected to a total of the 64 word lines is completed. That is, internal refresh is performed 64 times in a time sequence in response to activation of one refresh signal REF1.

Figure 5:
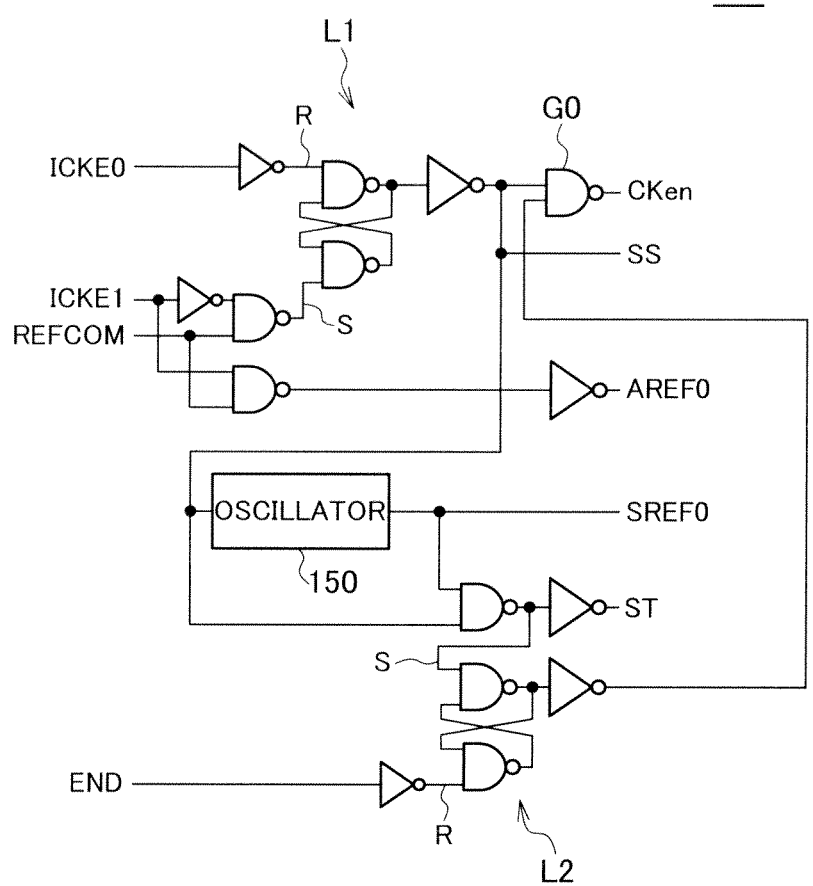
FIG. 5 is a main circuit diagram of indicative of an embodiment of a self-refresh control circuit 100.

Turning to FIG. 5, the self-refresh control circuit 100 includes SR latch circuits L1 and L2 and the oscillator 150. The SR latch circuits L1 and L2 both include a set node S and a reset node R and are set or reset when a low-level signal is input to the corresponding node.

To explain specifically, a signal indicating a negative AND of an inverse signal of the clock enable signal ICKE1 and the refresh command REFCOM is input to the set node S of the SR latch circuit L1. On the other hand, an inverse signal of the clock enable signal ICKE0 is input to the reset node R of the SR latch circuit L1. This causes the SR latch circuit L1 to be set when the clock enable signal ICKE1 has a low level and the refresh command REFCOM has a high level and to be reset when the clock enable signal ICKE0 has a high level. The clock enable signal ICKE1 has the low level and the refresh command REFCOM has the high level when the self-refresh command SRE is issued, and the clock enable signal ICKE0 has the high level when the self-refresh exit command SRX is issued. This means that the SR latch circuit L1 is set when the self-refresh command SRE is issued and reset when the self-refresh exit command SRX is issued. The SR latch circuit L1 outputs the self-state signal SS, which is supplied to the input buffer circuit 72 shown in FIG. 3.

The self-state signal SS is supplied also to the oscillator 150. The oscillator 150 starts in response to the self-state signal SS and periodically generates the self-refresh signal SREF0. Generation timings of the self-refresh signal SREF0 are asynchronous with the external clock signal CK. The self-refresh signal SREF0 is supplied to the OR gate circuit G1 shown in FIG. 3. The clock enable signal ICKE1 has a high level and the refresh command REFCOM has a high level when the auto-refresh command REF is issued, and a signal indicating an AND of the clock enable signal ICKE1 and the refresh command REFCOM is used as the auto-refresh signal AREF0. The auto-refresh signal AREF0 is also supplied to the OR gate circuit G1 shown in FIG. 3.

On the other hand, a signal indicating a negative AND of the self-state signal SS and the self-refresh signal SREF0 is input to the set node S of the SR latch circuit L2. An inverse signal of the update end signal END is input to the reset node R of the SR latch circuit L2. This causes the SR latch circuit L2 to be set each time the self-refresh signal SREF0 is activated and to be reset each time the update end signal END is activated in a state where the semiconductor device has entered the self-refresh mode.

A signal indicating an AND of the self-state signal SS and the self-refresh signal SREF0 is used as the update start signal ST. The update start signal ST is supplied to the DLL circuit 200 shown in FIG. 3.

Furthermore, outputs of the SR latch circuits L1 and L2 are supplied to a NAND gate circuit G0, and an output thereof is used as the enable signal CKen. Therefore, the enable signal CKen has a low level when the SR latch circuit L1 is set and the SR latch circuit L2 is reset. In other states, the enable signal CKen is always activated to a high level.

Figure 6:
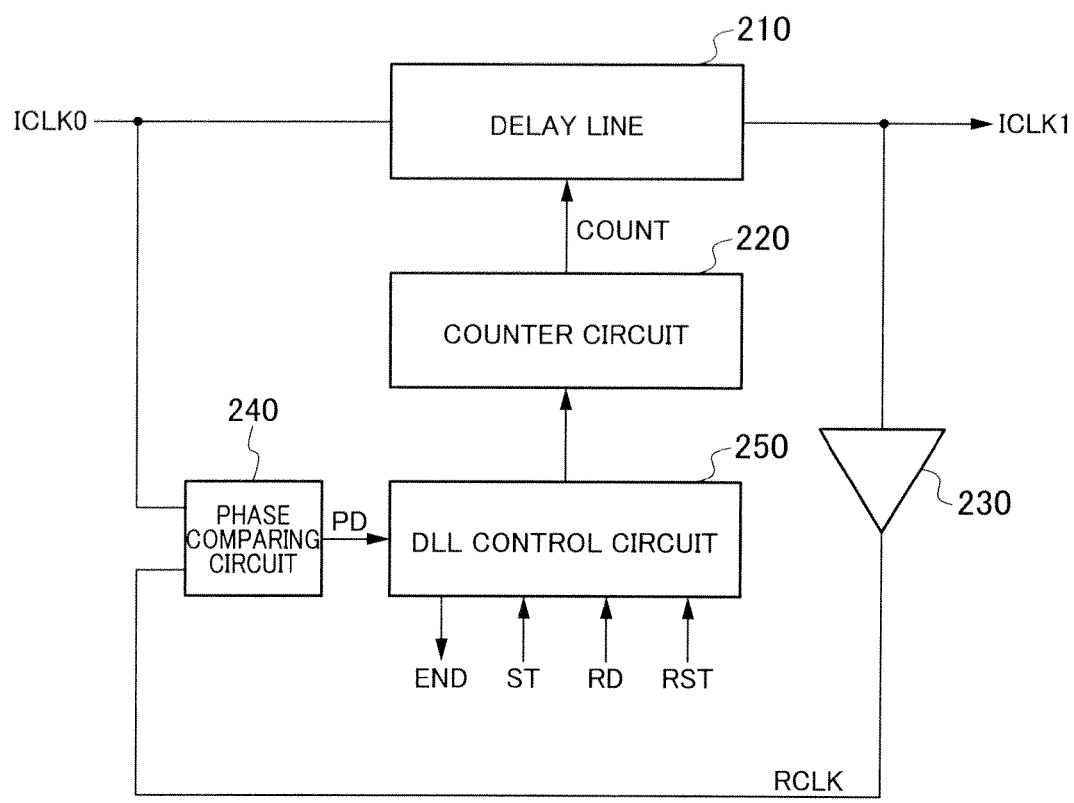
FIG. 6 is a block diagram indicative of an embodiment of a configuration of a DLL circuit 200.

Turning to FIG. 6, the DLL circuit 200 includes a delay line 210 that delays the internal clock signal ICLK0 to generate the internal clock signal ICLK1. The delay line 210 is a circuit that generates the internal clock signal ICLK1 by providing a delay corresponding to a count value COUNT of the counter circuit 220 to the internal clock signal ICLK0.

The internal clock signal ICLK1 is supplied to the output buffer circuit 30a shown in FIG. 2 and is supplied also to a replica buffer circuit 230. The replica buffer circuit 230 generates an internal clock signal RCLK as a replica based on the internal clock signal ICLK1 and has the same characteristics as the output buffer circuit 30a. Because the output buffer circuit 30a outputs read data DQ synchronously with the internal clock signal ICLK1, the internal clock signal RCLK output from the replica buffer circuit 230 is precisely synchronized with the read data DQ. In a DRAM, read data DQ needs to be precisely synchronized with the external clock signals CK and CKB and, when phase shifting occurs therebetween, the phase shifting needs to be detected and corrected. This detection is performed by the phase comparing circuit 240 and a result thereof is fed back to the counter circuit 220 through a DLL control circuit 250 to correct the phase shifting.

The phase comparing circuit 240 compares phases of the internal clock signal ICLK0 and the internal clock signal RCLK with each other and generates a phase determination signal PD based on a comparison result. The internal clock signal ICLK0 has the same timing as the external clock signals CK and CKB, and the internal clock signal RCLK has the same timing as read data DQ, which implies that the phase comparing circuit 240 indirectly compares phases of the external clock signals CK and CKB and the read data DQ with each other. When the comparison result indicates that the internal clock signal RCLK is behind the internal clock signal ICLK0, the phase determination signal PD is set to one of logic levels (a low level, for example). In response thereto, the DLL control circuit 250 counts down a count value of the counter circuit 220, thereby reducing a delay amount of the delay line 210. Conversely, when the internal clock signal RCLK is ahead of the internal clock signal ICLK0, the phase determination signal PD is set to the other logic level (a high level, for example). In response thereto, the DLL control circuit 250 counts up a count value of the counter circuit 220, thereby increasing a delay amount of the delay line 210. When phases of the internal clock signal ICLK0 and the internal clock signal RCLK are aligned with each other by periodically repeating this operation, phases of the read data DQ and the external clock signals CK and CKB are consequently aligned with each other.

The operation of the DLL control circuit 250 is controlled by a read signal RD, the update start signal ST, and the reset signal RST. The read signal RD is activated when a read command is issued and the DLL control circuit 250 continues the update operation of the counter circuit 220 while the read signal RD is activated. This corresponds to the first active state mentioned above and the internal clock signal ICLK1 phase-controlled is continuously generated. On the other hand, the update start signal ST is generated by the self-refresh control circuit 100 shown in FIG. 5 and, when the update start signal ST is activated, the DLL control circuit 250 performs the update operation of the counter circuit 220 for a predetermined period or a predetermined number of times. This corresponds to the second active state mentioned above and is performed to eliminate phase shifting caused by temperature or voltage changes. After the update operation of the counter circuit 220 is performed for the predetermined period or the predetermined number of times and thus the internal clock signal ICLK1 acquires a desired phase, the DLL control circuit 250 generates the update end signal END. At that time, the counter circuit 220 is not reset and transits to an inactive state with a count value at the time of generation of the update end signal END kept. Therefore, when the update start signal ST is periodically performed, the internal clock signal ICLK1 phase-controlled can be promptly generated when the read signal RD is issued.

The reset signal RST is activated when the DLL circuit 200 is to be entirely initialized. When the reset signal RST is activated, the count value of the counter circuit 220 is reset to an initial value and then the DLL circuit 200 is activated until the internal clock signal ICLK1 phase-controlled is generated. That is, previous update information is electrically discarded. Therefore, once the reset signal RST is activated, a certain time is required to enable output of the internal clock signal ICLK1 phase-controlled. The reset signal RST is automatically generated within the semiconductor device 10 and activated also when a reset command is issued from the controller 50.

The circuit configuration of the access control circuit 20 according to the first embodiment is as described above. An operation of the access control circuit 20 according to the first embodiment is explained next.

Figure 7:
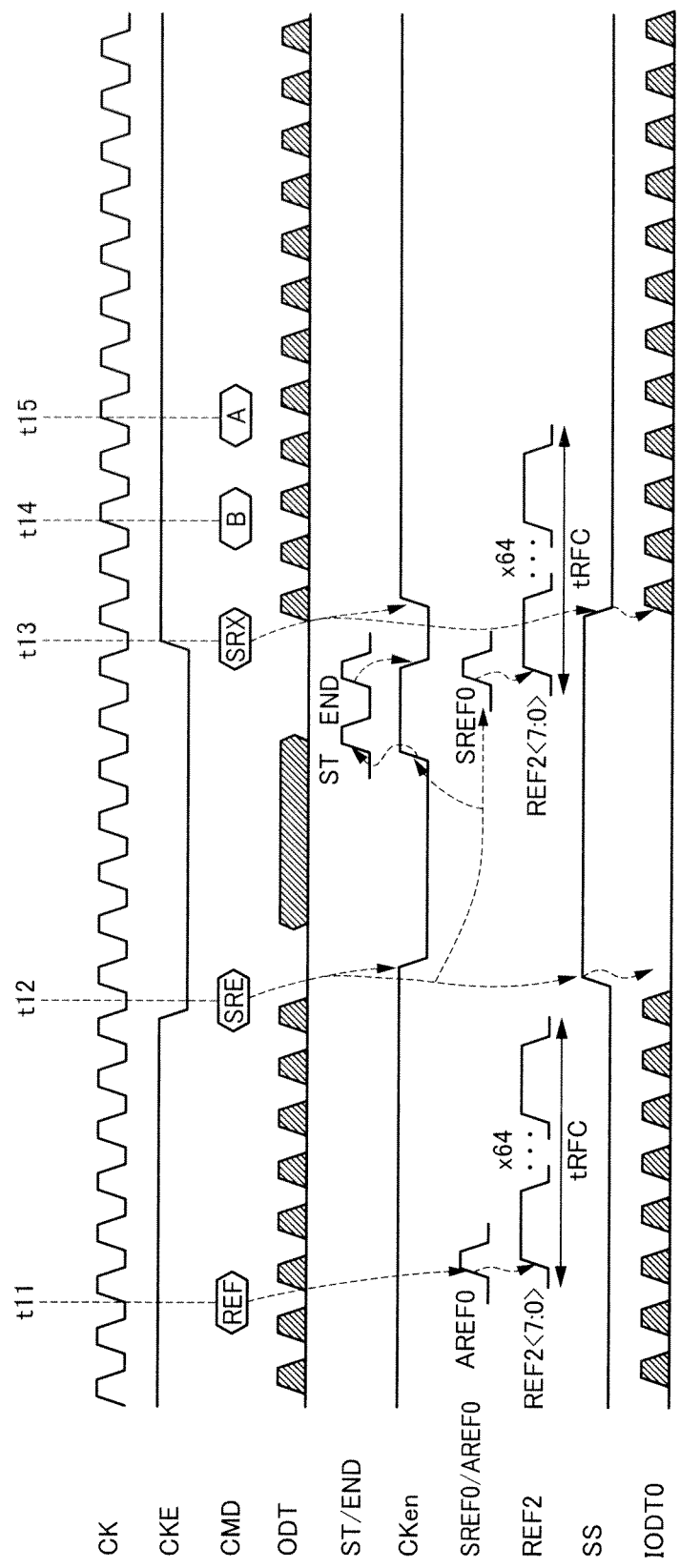
FIG. 7 is a timing chart for explaining an operation of the access control circuit 20 shown in FIGS. 1 to 3.

Turning to FIG. 7, the auto-refresh command REF is issued at a time t11, the self-refresh command SRE is issued at a time t12, and the self-refresh exit command SRX is issued at a time t13. Therefore, the semiconductor device 10 is in the self-refresh mode during a period of time from t12 to t13 and the semiconductor device 10 is not in the self-refresh mode during other periods.

Figure 8:
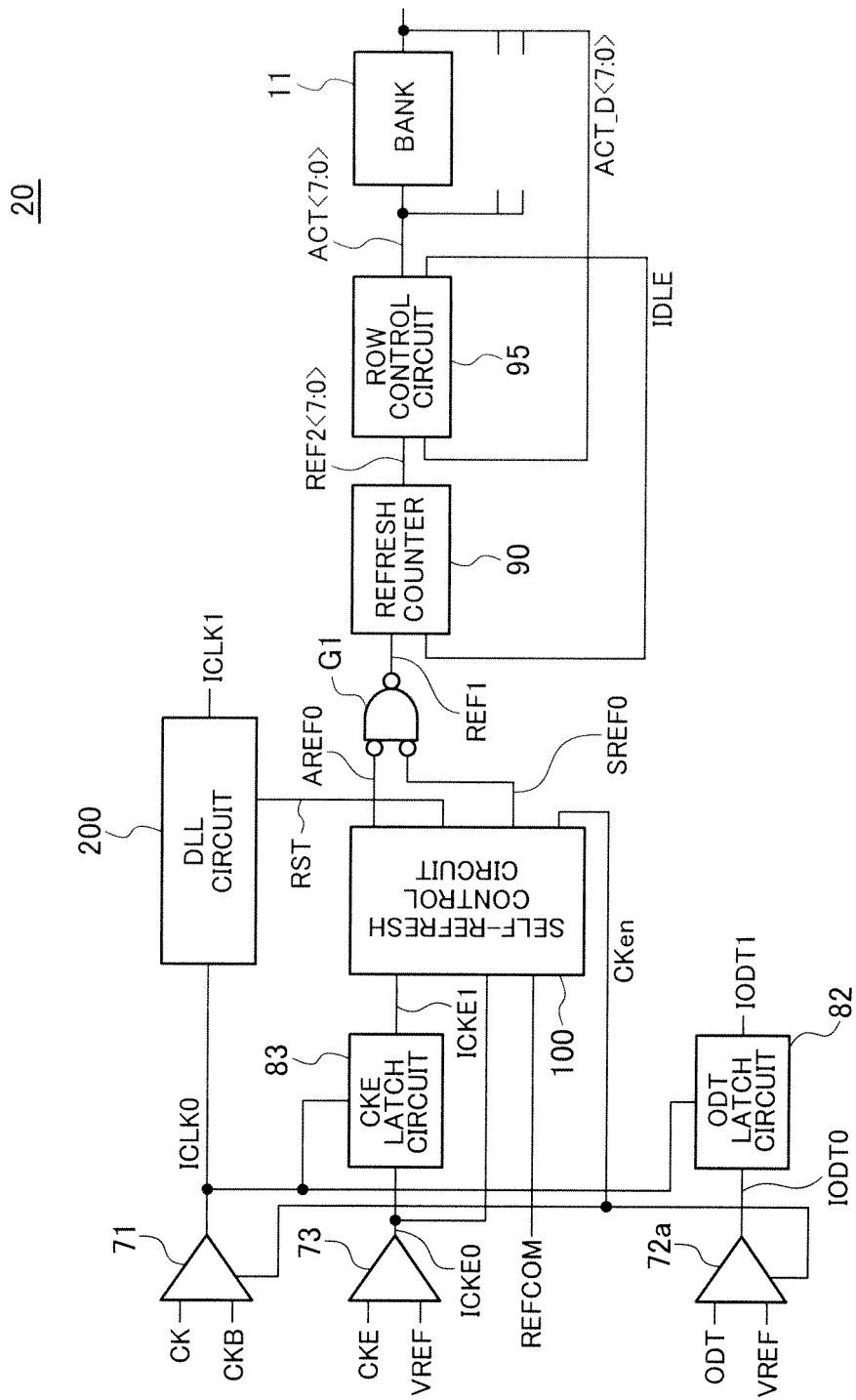
FIG. 8 is another block diagram indicative of an embodiment of main circuit blocks included in an access control circuit 20 and shows a case where an information processing system operates in a first operation mode complying with the DRAM standards.

During the periods in which the semiconductor device 10 is not in the self-refresh mode, the SR latch circuit L1 shown in FIG. 5 is reset and thus the self-state signal SS is fixed to a low level. Accordingly, the input buffer circuit 72 shown in FIG. 3 is in an active state and the impedance control signal ODT can be input from the controller 50. The impedance control signal IODT0 is latched by the ODT latch circuit 82 synchronously with the internal clock signal ICLK0, and the impedance control signal IODT0 as a latched signal is supplied to the output buffer circuit 30a. Therefore, the impedance control signal ODT needs to be input synchronously with a rising edge of the external clock signal CK. Accordingly, input of the impedance control signal ODT is effective during a period in which a setup margin and a hold margin from a rising edge of the external clock signal CK are ensured, and is ineffective in other periods. In FIG. 7, the periods in which input of the impedance control signal ODT is ineffective (Don't care) are shown by hatching. In the example shown in FIG. 7, the impedance control signal ODT is not input (that is, Don't care) in most of the period when the semiconductor device 10 is in the self-refresh mode. The impedance control signal ODT cannot be input from the controller 50 in most of the period when the semiconductor device 10 is in the self-refresh mode because the input buffer circuit 72 is inactivated in this period. Specifically, logic of generating the self-state signal SS shown in FIG. 5 is simplified to facilitate understanding, and the input buffer circuit 72 shown in FIG. 3 is activated to introduce the impedance control signal ODT supplied from outside into the semiconductor device each time the self-refresh command SRE is issued at the time t12 and the self-refresh exit command SRX is issued at the time t13. The same holds true for the ODT latch circuit 82 that generates the impedance control signal IODT1, the internal clock signal ICLK0 for controlling the ODT latch circuit 82, and the enable signal CKen for generating the internal clock signal ICLK0. That is, the self-refresh control circuit 100 shown in FIG. 5 contributes to clear understanding of a difference from a self-refresh control circuit 100 compliant with the DRAM standards, which is shown in FIG. 8 and explained later, for example.

When the auto-refresh command REF is issued at the time t11, the auto-refresh signal AREF0 is activated. In response thereto, the refresh counter 90 generates the refresh signals REF2<7:0> for the corresponding banks eight times and the row control circuit 95 supplies the active signals ACT<7:0> to the corresponding banks eight times. The refresh address is incremented in the row control circuit 95, which causes eight different word lines to be selected one after another synchronously with the eight active signals ACT<7:0>. As a result, a total of 64 word lines are selected. To select these 64 word lines, a refresh period tRFC is required. Therefore, issuance of other commands by the controller 50 is inhibited after the auto-refresh command REF is issued and before the refresh period tRFC passes.

When the self-refresh command SRE is issued at the time t12, the SR latch circuit L1 shown in FIG. 5 is set and the self-state signal SS is changed to a high level. This inactivates the input buffer circuit 72 shown in FIG. 3, thereby reducing power consumption. Furthermore, the enable signal CKen is changed to a low level because the SR latch circuit L2 is reset. This inactivates also the input buffer circuit 71 shown in FIG. 3, thereby reducing power consumption.

When the semiconductor device enters the self-refresh mode, the oscillator 150 periodically outputs the refresh signal SREF0. When the refresh signal SREF0 is activated, the refresh counter 90 performs the same operation as that performed when the auto-refresh signal AREF0 is activated. That is, a total of 64 word lines are selected one after another. Furthermore, when the refresh signal SREF0 is activated, the SR latch circuit L2 shown in FIG. 5 is set and thus the enable signal CKen is changed to a high level. This activates the input buffer circuit 71 shown in FIG. 3, thereby enabling reception of the external clock signal CK. Because the update start signal ST is also activated, the DLL circuit 200 generates the internal clock signal ICLK1 phase-controlled, based on the internal clock signal ICLK0 output from the input buffer circuit 71. That is, the update operation of the DLL circuit 200 is performed.

When the update operation of the DLL circuit 200 ends, the DLL circuit 200 outputs the update end signal END and then the SR latch circuit L2 is reset. This causes the enable signal CKen to be changed to the low level again, thereby inactivating the input buffer circuit 71. Therefore, power consumption of the input buffer circuit 71 can be reduced during periods other than an update time of the DLL circuit 200 performing self refresh. At that time, the counter circuit 220 is not reset and transits to an inactive state with a count value at the time of generation of the update end signal END kept.

While the refresh signal SREF0 is activated once in FIG. 7, the refresh signal SREF0 is periodically generated by the oscillator 150 during a period when the semiconductor device has entered the self-refresh mode. Accordingly, the input buffer circuit 71 and the DLL circuit 200 are activated each time the refresh signal SREF0 is generated. In this way, because the input buffer circuit 71 and the DLL circuit 200 are intermittently activated even when the semiconductor device has entered the self-refresh mode, the DLL circuit 200 can keep a locked state (a state where the internal clock signal ICLK0 and the internal clock signal RCLK have phases almost matched). In addition, because the input buffer circuit 71 and the DLL circuit 200 are not always activated but intermittently activated based on the refresh signal SREF0 during the self-refresh mode and are inactivated during other periods, useless power consumption can be avoided.

When the self-refresh exit command SRX is issued at the time t13, the SR latch circuit L1 shown in FIG. 5 is reset, the self-state signal SS is changed to the low level, and the enable signal CKen is changed to the high level. This activates the input buffer circuits 71 and 72 and enables input of the external clock signal CK and the impedance control signal ODT.

At that time, the DLL circuit 200 is already in the locked state and thus the controller 50 can issue the command for controlling a state of the data terminal synchronously with the internal clock signal ICLK1, that is, the second command in a short time. The second command is denoted by B in FIG. 7 and is input at a time t14. A minimum period after the self-refresh exit command SRX is issued and before the second command B can be issued is 24 nanoseconds (ns), for example. That is, issuance of the second command B is allowed 24 ns after the self-refresh exit command SRX is issued.

On the other hand, the command for performing an access to the memory cell array 11 based on a row address, that is, the first command cannot be issued at least until passage of the refresh period tRFC from issuance of the self-refresh exit command SRX. This is because the refresh operation is performed asynchronously with the external clock signal CK during the self-refresh mode and thus the refresh operation may be performed when the self-refresh exit command SRX is issued. The first command is denoted by A in FIG. 7 and is input at a time t15. A minimum period after the self-refresh exit command SRX is issued and before the first command A can be issued is tRFC+10 ns, for example. That is, issuance of the first command A is allowed when tRFC+10 ns have passed from issuance of the self-refresh exit command SRX.

As described above, according to the first embodiment, the input buffer circuit 71 and the DLL circuit 200 are intermittently activated in conjunction with each other and therefore the locked state of the DLL circuit 200 can be maintained during a period when the semiconductor device has entered the self-refresh mode. This enables issuance of the second command at a short time after the self-refresh exit command SRX is issued. In addition, the input buffer circuit 71 and the DLL circuit 200 are not always activated but intermittently activated in conjunction with each other based on the refresh signal SREF0, and are inactivated during other periods. Accordingly, increase in the power consumption can be minimized.

Because not specified in the DRAM standards, the operation of the first embodiment mentioned above cannot ensure as it is compatibility with a DRAM complying with the standards. When this causes a problem, it is desirable to use a configuration that enables to switch between the operation of the first embodiment and the operation specified in the standards. That is, it suffices to design a circuit to perform the operation meeting the DRAM standards in the first operation mode and perform the operation of the first embodiment in the second operation mode.

Turning to FIG. 8, while a circuit shown in FIG. 8 is different from that shown in FIG. 3, it is unnecessary to separately provide the circuit shown in FIG. 3 and that shown in FIG. 8 but it suffices to switch functions according to a selected operation mode. Therefore, it suffices to realize function switching by using a gate circuit or the like (not shown) to function as the circuit shown in FIG. 8 when the first operation mode is selected and to function as the circuit shown in FIG. 3 when the second operation mode is selected. The same holds true for the circuit shown in FIG. 9.

In the access control circuit 20 shown in FIG. 8, the enable signal CKen is supplied to an input buffer circuit 72a in addition to the input buffer circuit 71. This eliminates the use of the self-state signal SS. With this configuration, when the semiconductor device enters the self-refresh mode, the input buffer circuits 71 and 72a are both fixed to an inactive state. Accordingly, power consumption is reduced more than in the second operation mode.

Figure 9:
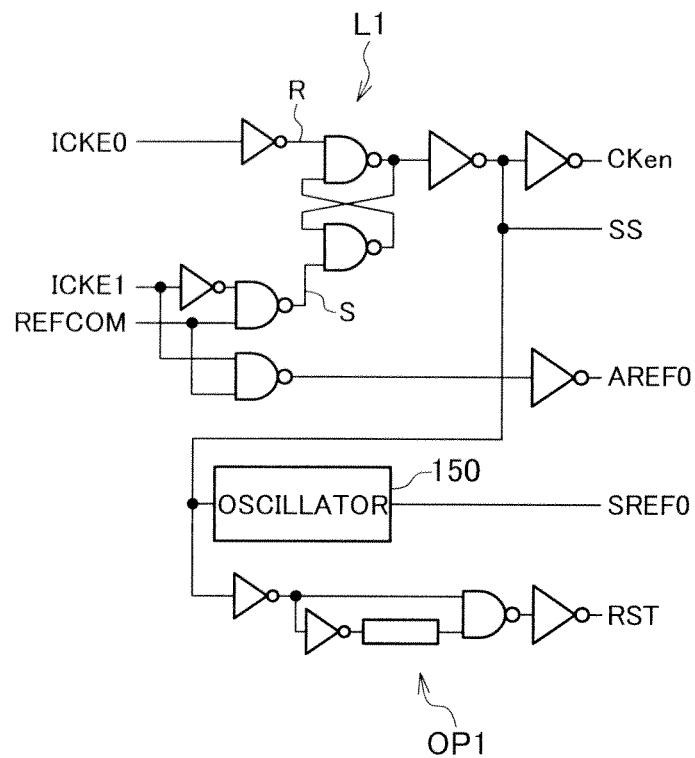
FIG. 9 is a main circuit diagram indicative of an embodiment of a self-refresh control circuit 100 shown in FIG. 8.

Turning to FIG. 9, the self-refresh control circuit 100 does not require the SR latch circuit L2 and uses a one-shot pulse generating circuit OP1 instead. The one-shot pulse generating circuit OP1 activates the reset signal RST in response to change of the self-state signal SS from a high level to a low level. Therefore, in the first operation mode, the DLL circuit 200 is reset when the self-refresh exit command SRX is issued.

Figure 10:
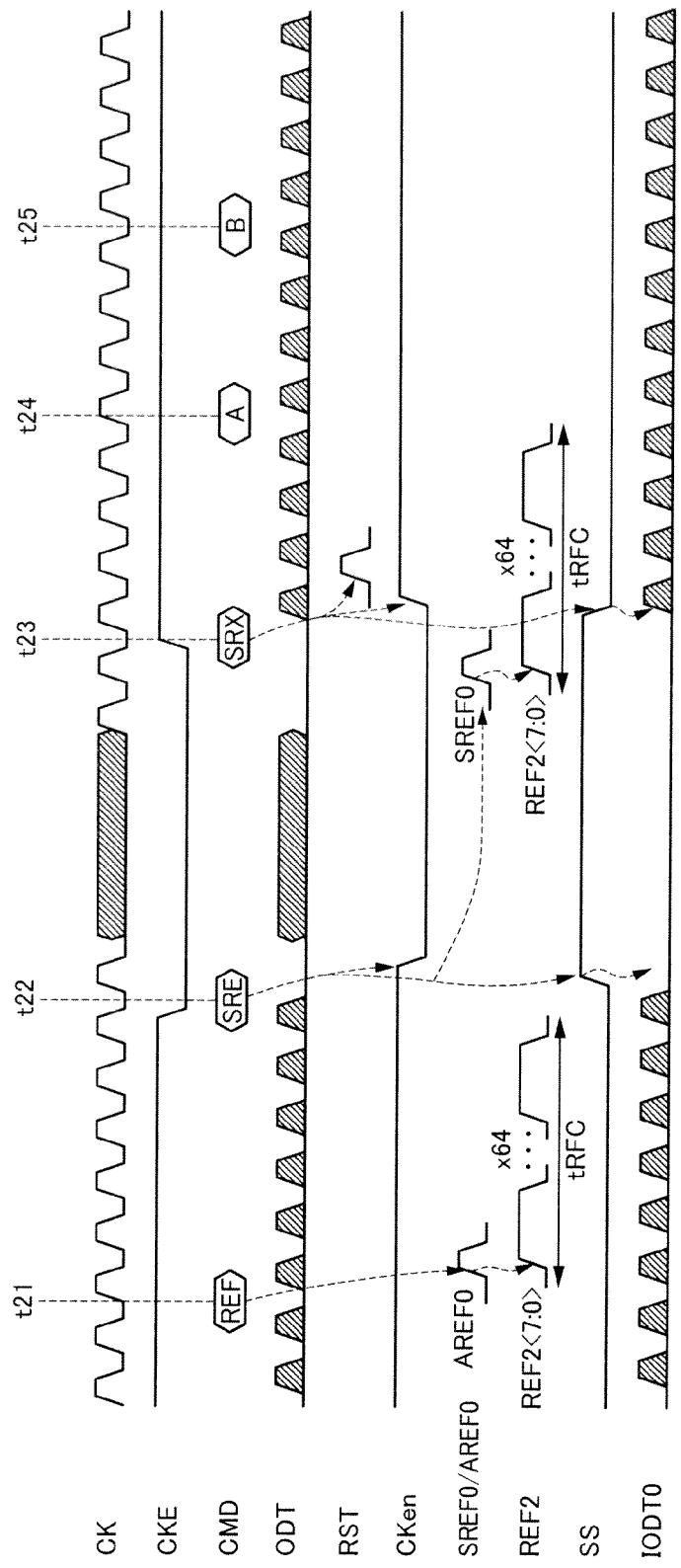
FIG. 10 is a timing chart for explaining an operation of the access control circuit 20 in the first operation mode.

Turning to FIG. 10, the auto-refresh command REF is issued at a time t21, the self-refresh command SRE is issued at a time t22, and the self-refresh exit command SRX is issued at a time t23. Therefore, the semiconductor device 10 is in the self-refresh mode during a period of time from t22 to t23 and the semiconductor device 10 is not in the self-refresh mode during other periods.

During the periods in which the semiconductor device 10 is not in the self-refresh mode, the SR latch circuit L1 shown in FIG. 9 is reset and thus the enable signal CKen is fixed to a high level. Accordingly, the input buffer circuits 71 and 72a shown in FIG. 8 are active. When the auto-refresh command REF is issued at the time t21 in this state, the auto refresh signal AREF0 is activated. An operation performed in this case is as explained with reference to FIG. 7.

When the self-refresh command SRE is issued at the time t22, the SR latch circuit L1 shown in FIG. 9 is set and the enable signal CKen is changed to a low level. This inactivates the input buffer circuits 71 and 72a shown in FIG. 8 and reduces power consumption. Furthermore, the refresh signal SREF0 is periodically output from the oscillator 150 and the same operation as in the case where the auto refresh signal AREF0 is activated is performed. While the refresh signal SREF0 is activated once in FIG. 10, the refresh signal SREF0 is periodically generated by the oscillator 150 during the period when the semiconductor device 10 has entered the self-refresh mode.

In the first operation mode, the input buffer circuit 71 is always kept in an inactive state during the period when the semiconductor device has entered the self-refresh mode. Accordingly, the controller does not supply the external clock signals CK and CKB. This enables reduction in power consumption of the system. In the first operation mode, the external clock signals CK and CKB are not supplied to the semiconductor device and thus the DLL circuit 200 is also kept in an inactive state. Accordingly, power consumption during the period when the semiconductor device has entered the self-refresh mode is reduced more than in the second operation mode mentioned above. Because the input buffer circuit 72a is inactivated during the period when the semiconductor device has entered the self-refresh mode, the impedance control signal ODT cannot be input during this period. This means that, in a system that commonly uses data terminals of a plurality of semiconductor devices (that is, a configuration in which the data terminals of the semiconductor devices are commonly connected to a data bus of the system), when a controller causes one of the semiconductor devices to enter the self-refresh mode, for example, an impedance of the data terminal thereof cannot be adjusted and thus the write command WT cannot be issued to the other semiconductor device. This is because prevention of data reflection is essential in a system to which high frequency data are transferred. On the other hand, in a power-down mode, impedance adjustment of the data terminal can be performed during that period. Therefore, in this case, the controller selects the power-down mode in the first operation mode, instead of the self-refresh mode in which power consumption is low. From this viewpoint, accordingly, it is desirable that the self-refresh mode with low power consumption be selected while impedance adjustment of the data terminal can be performed during the self-refresh mode. This will be explained in detail in a third embodiment of the present invention.

When the self-refresh exit command SRX is issued at the time t23, the SR latch circuit L1 shown in FIG. 9 is reset and the enable signal CKen is changed to the high level. This activates the input buffer circuits 71 and 72a and enables input of the external clock signal CK and the impedance control signal ODT. Furthermore, the reset signal RST is output from the one-shot pulse generating circuit OP1, thereby resetting the DLL circuit 200. As described above, the reset signal RST is for entirely initializing the DLL circuit 200 and, when the reset signal RST is activated, the count value of the counter circuit 220 is reset to an initial value. Accordingly, a certain time is required to enable output of the internal clock signal ICLK1 phase-controlled. In this example, issuance of the second command is inhibited until 512 clock cycles have passed from issuance of the self-refresh exit command SRX. The 512 clock cycles are longer than a maximum period required to lock the DLL circuit 200 after the DLL circuit 200 is reset. That is, when the 512 clock cycles have passed, it means that the DLL circuit 200 is definitely locked. In the example shown in FIG. 10, the second command B is issued at a time t25.

A timing when the first command can be issued after the self-refresh exit command SRX is issued is the same as that in the second operation mode mentioned above. In the example shown in FIG. 10, the first command A is issued at a time t24.

As described above, when the first operation mode is selected, the operation complying with the standards is performed although the locked state of the DLL circuit 200 is not maintained. Therefore, compatibility with the existing DRAM can be ensured. In addition, power consumption during the period when the semiconductor device has entered the self-refresh mode can be reduced more than when the second operation mode is selected. Furthermore, frequencies of the external clock signals CK and CKB can be changed when the semiconductor device exits the self-refresh mode after the semiconductor device enters the self-refresh mode. In the second operation mode, supply of the external clock signals CK and CKB needs to be continued even in the self-refresh mode and thus the frequencies of the external clock signals CK and CKB cannot be changed even when the semiconductor device enters the self-refresh mode.

A second embodiment of the present invention is explained next.

Figure 11:
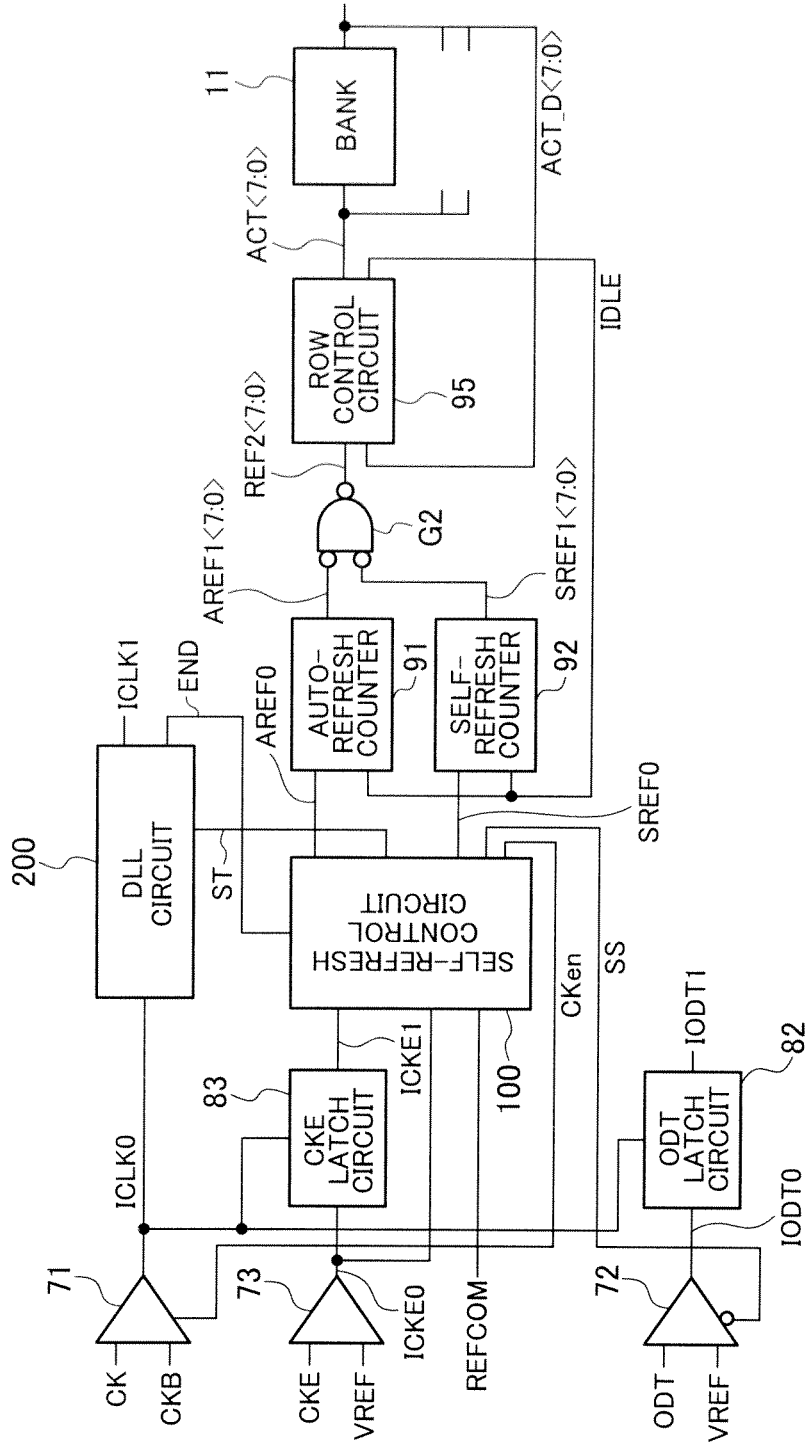
FIG. 11 is a block diagram indicative of an embodiment of main circuit blocks included in an access control circuit 20a according to a second embodiment.

Turning to FIG. 11, the access control circuit 20a is different from the access control circuit 20 shown in FIG. 3 in that an auto-refresh counter 91 and a self-refresh counter 92 are included instead of the refresh counter 90 and that an OR gate circuit G2 is arranged at a subsequent stage of the counters 91 and 92. Other features of the access control circuit 20a are basically the same as those of the access control circuit 20 shown in FIG. 3, and therefore like elements are denoted by like reference characters and redundant explanations thereof will be omitted.

As shown in FIG. 11, the auto-refresh signal AREF0 is supplied from the self-refresh control circuit 100 to the auto-refresh counter 91, and the self-refresh signal SREF0 is supplied from the self-refresh control circuit 100 to the self-refresh counter 92. The auto-refresh counter 91 outputs an auto-refresh signal AREF1 and the self-refresh counter 92 outputs a self-refresh signal SREF1. These auto-refresh signal AREF1 and self-refresh signal SREF1 are input to the OR gate circuit G2, and a refresh signal REF2 output thereof is supplied to the row control circuit 95.

Figures 12A, 12B:
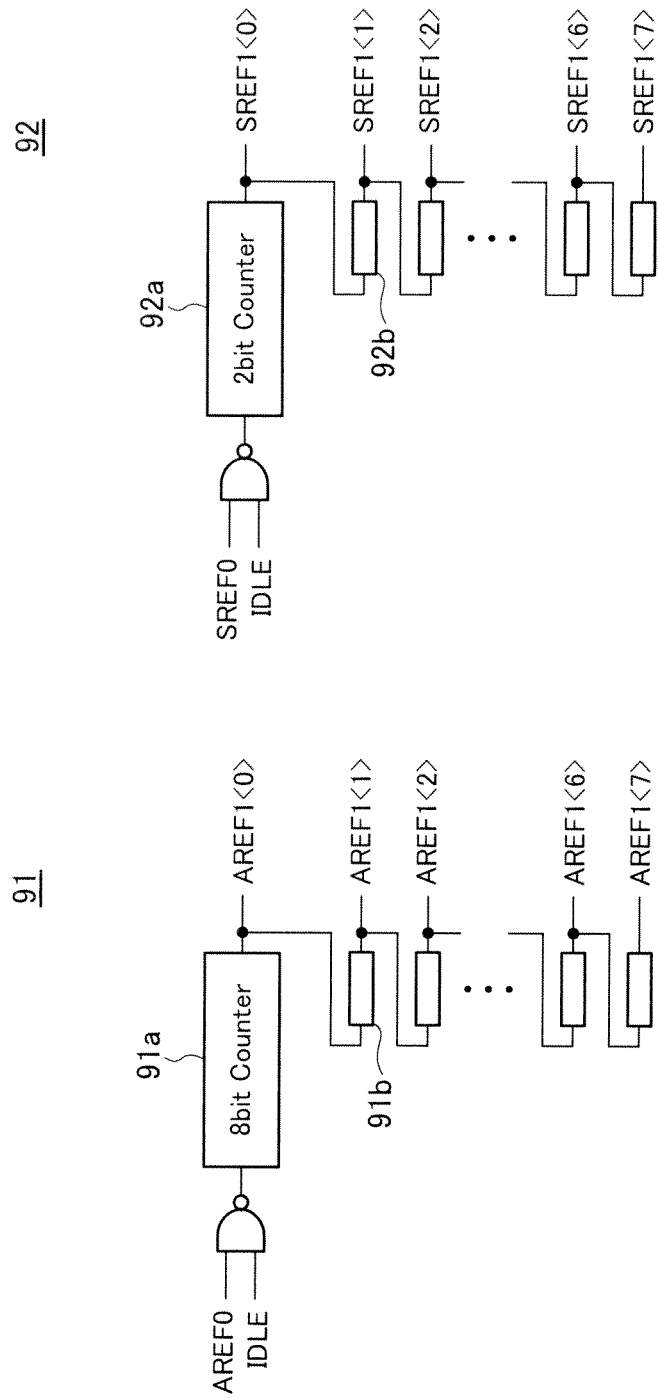
FIG. 12A is a circuit diagram indicative of an embodiment of an auto-refresh counter 91.
FIG. 12B is a circuit diagram indicative of an embodiment of a self-refresh counter 92.

Turning to FIG. 12A, the auto-refresh counter 91 includes an 8-bit counter 91a that performs an 8-count operation when the auto-refresh signal AREF0 and the idle signal IDLE are both activated to a high level. The idle signal IDLE has a high level when the row control circuit 95 is in an idle state. Therefore, when the auto-refresh signal AREF0 is activated in a case where the row control circuit 95 is in an idle state, the 8-bit counter 91a generates an auto-refresh signal AREF1<0> eight times. The auto-refresh signal AREF1<0> passes through a plurality of delay circuits 91b cascade-connected and is output as auto-refresh signals AREF1<1> to AREF1<7>. Accordingly, the auto-refresh signals AREF1<0> to AREF1<7> are activated in a staggered operation with timings thereof slightly shifted with each other. This is to shift timings of refresh operations in the respective banks with each other to suppress a peak current.

With this configuration, when the auto-refresh signal AREF0 is activated in the case where the row control circuit 95 is in an idle state, each of the auto-refresh signals AREF1<0> to AREF1<7> is activated eight times. These signals are supplied to the row control circuit 95 through the OR gate circuit G2. When the refresh signal REF2 is activated, the refresh operation is performed for a refresh address indicated by an address counter included in the row control circuit 95 and also a value of the address counter is incremented (or decremented). This causes eight word lines to be selected one after another in each bank, so that memory cells MC connected to the selected word lines are refreshed.

On the other hand, turning to FIG. 12B, the self-refresh counter 92 includes a 2-bit counter 92a that performs a 2-count operation when the self-refresh signal SREF0 and the idle signal IDLE are both activated to a high level. Therefore, when the self-refresh signal SREF0 is activated in a case where the row control circuit 95 is in an idle state, the 2-bit counter 92a generates a self-refresh signal SREF1<0> twice. The self-refresh signal SREF1<0> passes through a plurality of delay circuits 92b cascade-connected and is output as self-refresh signals SREF1<1> to SREF1<7>.

With this configuration, when the self-refresh signal SREF0 is activated in the case where the row control circuit 95 is in an idle state, each of the self-refresh signals SREF1<0> to SREF1<7> is activated twice. This causes two word lines to be selected one after the other in each bank, so that memory cells MC connected thereto are refreshed.

Figure 13:
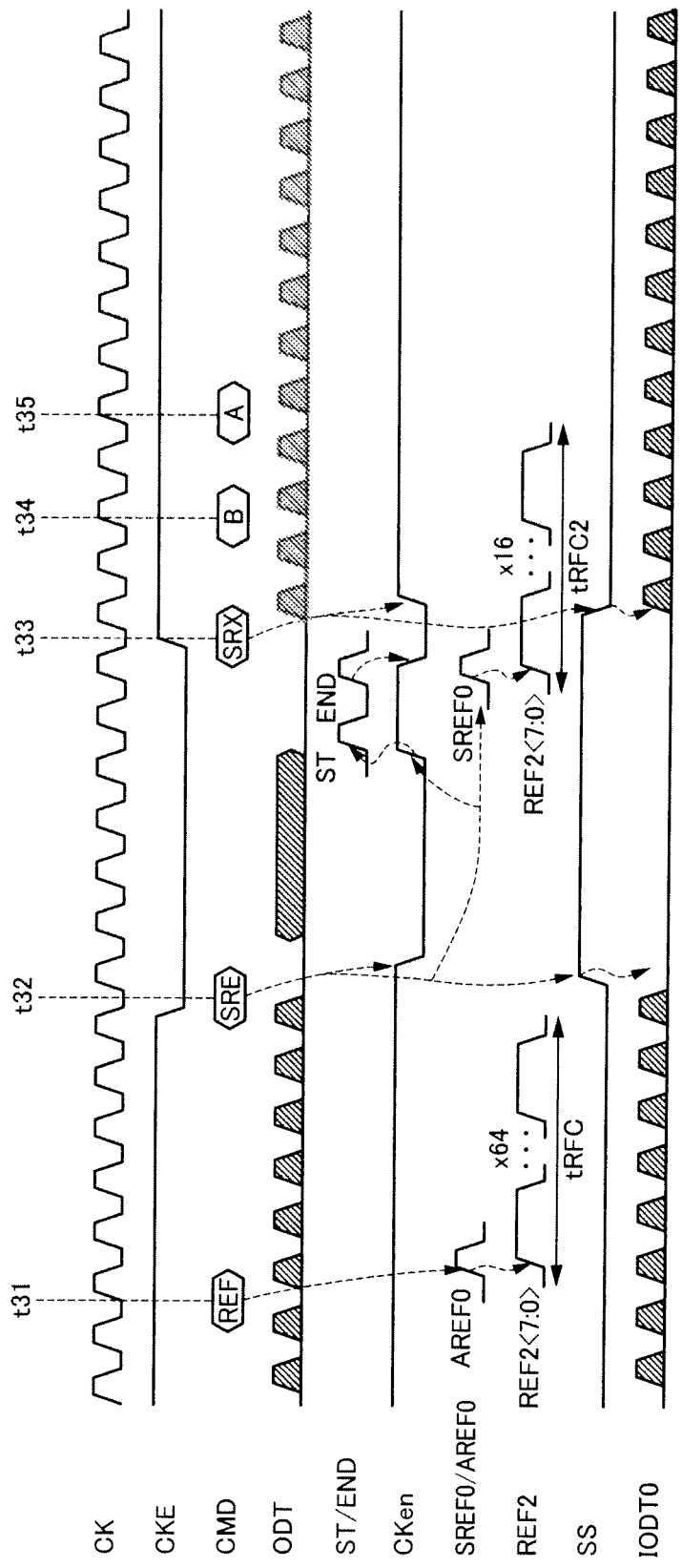
FIG. 13 is a timing chart for explaining an operation of the access control circuit 20a according to the second embodiment.

Turning to FIG. 13, the auto-refresh command REF is issued at a time t31, the self-refresh command SRE is issued at a time t32, and the self-refresh exit command SRX is issued at a time t33. Therefore, the semiconductor device 10 is in the self-refresh mode during a period of time from t32 to t33 and the semiconductor device 10 is not in the self-refresh mode during other periods.

An operation performed during a period before the semiconductor device 10 enters the self-refresh mode is the same as that in the first embodiment. Therefore, when the auto-refresh command REF is issued at the time t31, the row control circuit 95 supplies an active signal to each bank eight times. This causes eight word lines to be selected one after another, so that memory cells MC connected to a total of 64 word lines are refreshed. As mentioned above, the refresh period tRFC is required to select 64 word lines. Therefore, issuance of other commands is inhibited until the refresh period tRFC has passed after issuance of the auto-refresh command REF.

When the self-refresh command SRE is issued at the time t32, the semiconductor device 10 enters the self-refresh mode. The DLL circuit 200 performs the operation mentioned above during the period when the semiconductor device 10 has entered the self-refresh mode, and the update operation of the DLL circuit 200 is performed synchronously with the refresh signal SREF0 periodically output from the oscillator 150. Accordingly, the locked state of the DLL circuit 200 is maintained also during the period when the semiconductor device 10 has entered the self-refresh mode.

When the refresh signal SREF0 is activated, the self-refresh signal SREF1<0> is output twice by the 2-bit counter 92a included in the self-refresh counter 92, and the row control circuit 95 supplies the active signals ACT<7:0> to the corresponding banks twice. This causes two word lines to be selected one after the other, so that memory cells MC connected to a total of 16 word lines are refreshed. A refresh period tRFC2 required to select 16 word lines is shorter than the refresh period tRFC required to select 64 word lines and is about a quarter thereof. Accordingly, a period when the oscillator 150 issues the refresh signal SREF0 is also reduced to a quarter of that in the first embodiment.

When the self-refresh exit command SRX is issued at the time t33, the input buffer circuits 71 and 72 are activated and input of the external clock signal CK and the impedance control signal CDT is enabled. Because the DLL circuit 200 is already in the locked state at that time, the command for controlling a state of the data terminal synchronously with the internal clock signal ICLK1, that is, the second command can be issued in a short time. This feature is the same as that in the first embodiment. The second command B is issued at a time t34 in FIG. 13.

On the other hand, the command for performing an access to the memory cell array 11 based on a row address, that is, the first command cannot be issued at least until passage of the refresh period tRFC2 from issuance of the self-refresh exit command SRX. The first command is denoted by A in FIG. 13 and is issued at a time t35. In the second embodiment, a minimum period after the controller 50 issues the self-refresh exit command SRX and before the first command A can be issued is tRFC2+10 ns, for example. That is, issuance of the first command A is allowed when tRFC2+10 ns have passed from issuance of the self-refresh exit command SRX. Because tRFC2<tRFC, the period from issuance of the self-refresh exit command SRX until the first command can be input can be greatly reduced as compared to the first embodiment.

As described above, according to the second embodiment, the effect of the first embodiment mentioned above can be obtained and also the period from issuance of the self-refresh exit command SRX until the first command can be input can be greatly reduced. Also the operation of the second embodiment is not specified in the DRAM standards and thus it is desirable to use a configuration that enables switching between the operation of the second embodiment and the operation specified in the standards. That is, it suffices to design a circuit to perform the operation complying with the DRAM standards in the first operation mode and perform the operation of the second embodiment mentioned above in the second operation mode. The first operation mode is as already explained. For example, the operations of the first and second embodiments can be combined in the second operation mode.

The third embodiment of the present invention is explained next.

Figure 14:
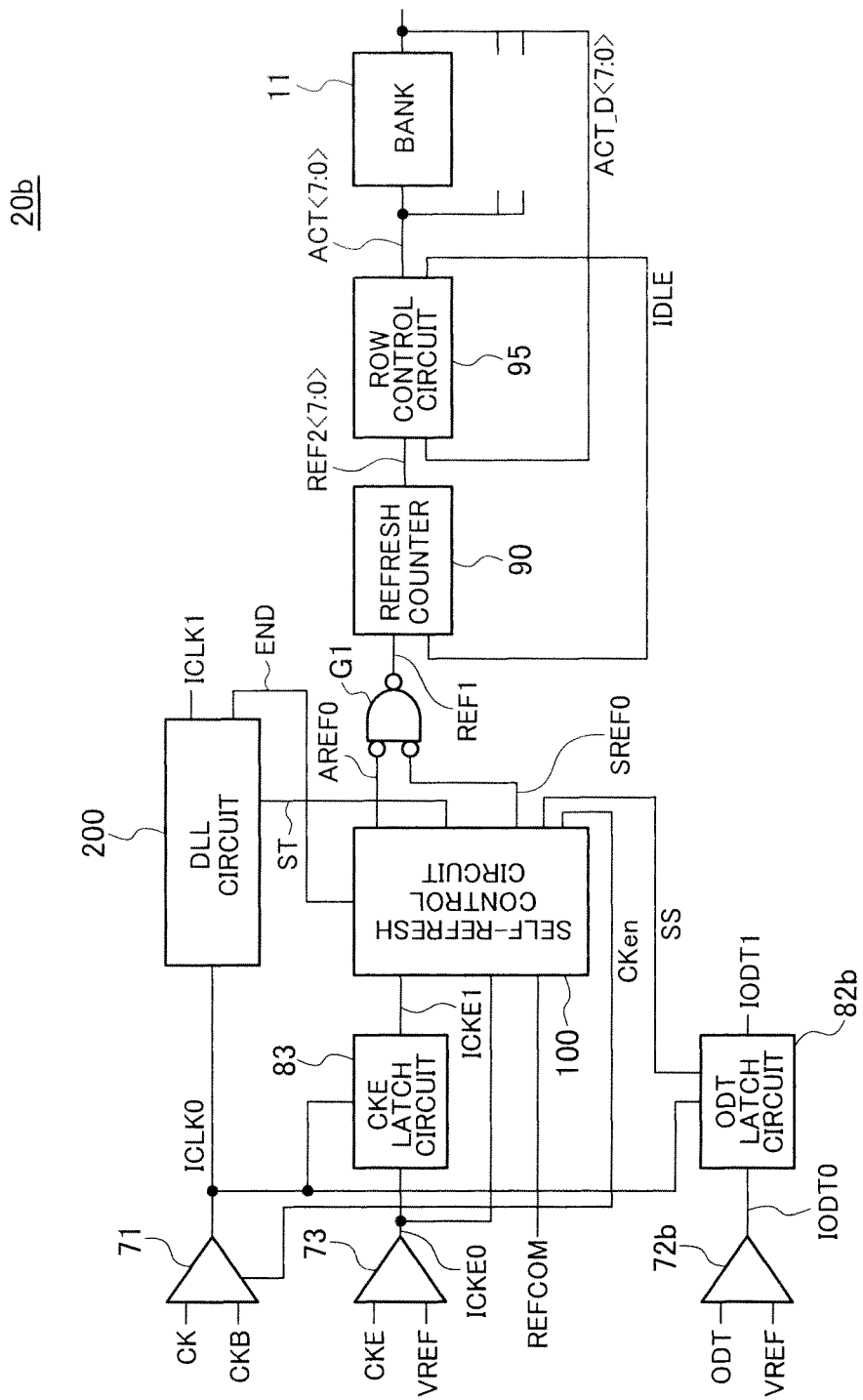
FIG. 14 is a block diagram indicative of an embodiment of main circuit blocks included in an access control circuit 20b according to a third embodiment.

The access control circuit 20b shown in FIG. 14 is different from the access control circuit 20 shown in FIG. 3 in that the input buffer circuit 72 is replaced by an input buffer circuit 72b and that the ODT latch circuit 82 is replaced by an ODT latch circuit 82b. Other features of the access control circuit 20b are basically the same as those of the access control circuit 20 shown in FIG. 3, and therefore like elements are denoted by like reference characters and redundant explanations thereof will be omitted. In the third embodiment, the input buffer circuit 72b is always activated and therefore the controller 50 can input the impedance control signal ODT even during a period when the semiconductor device has entered the self-refresh mode. Accordingly, even when one of semiconductor devices has been entered the self-refresh mode, the controller 50 can perform an impedance control of a data terminal of the semiconductor device and can issue the write command WT to the other semiconductor device. This enables the controller 50 to control the other semiconductor device while reducing power consumption.

Figure 15:
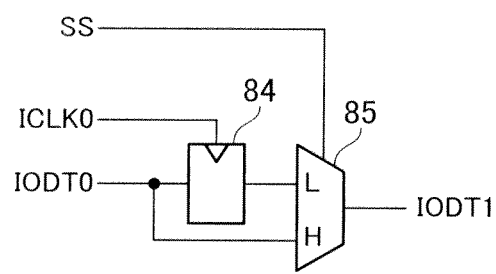
FIG. 15 is a circuit diagram indicative of an embodiment of an ODT latch circuit 82b.

Turning to FIG. 15, the ODT latch circuit 82b includes a latch circuit 84 and a selector 85. The latch circuit 84 latches the impedance control signal IODT0 synchronously with the internal clock signal ICLK0. The selector 85 is a circuit that selects one of an output from the latch circuit 84 and the impedance control signal IODT0, and selection is performed based on the self-state signal SS. Specifically, the output from the latch circuit 84 is selected when the self-state signal SS has a low level and the impedance control signal IODT0 is selected when the self-state signal SS has a high level. This means that the output from the latch circuit 84 is used as the impedance control signal IODT1 during a period when the semiconductor device is not in the self-refresh mode and that the impedance control signal IODT0 is used as it is as the impedance control signal IODT1 during a period when the semiconductor device has entered the self-refresh mode.

Figure 16:
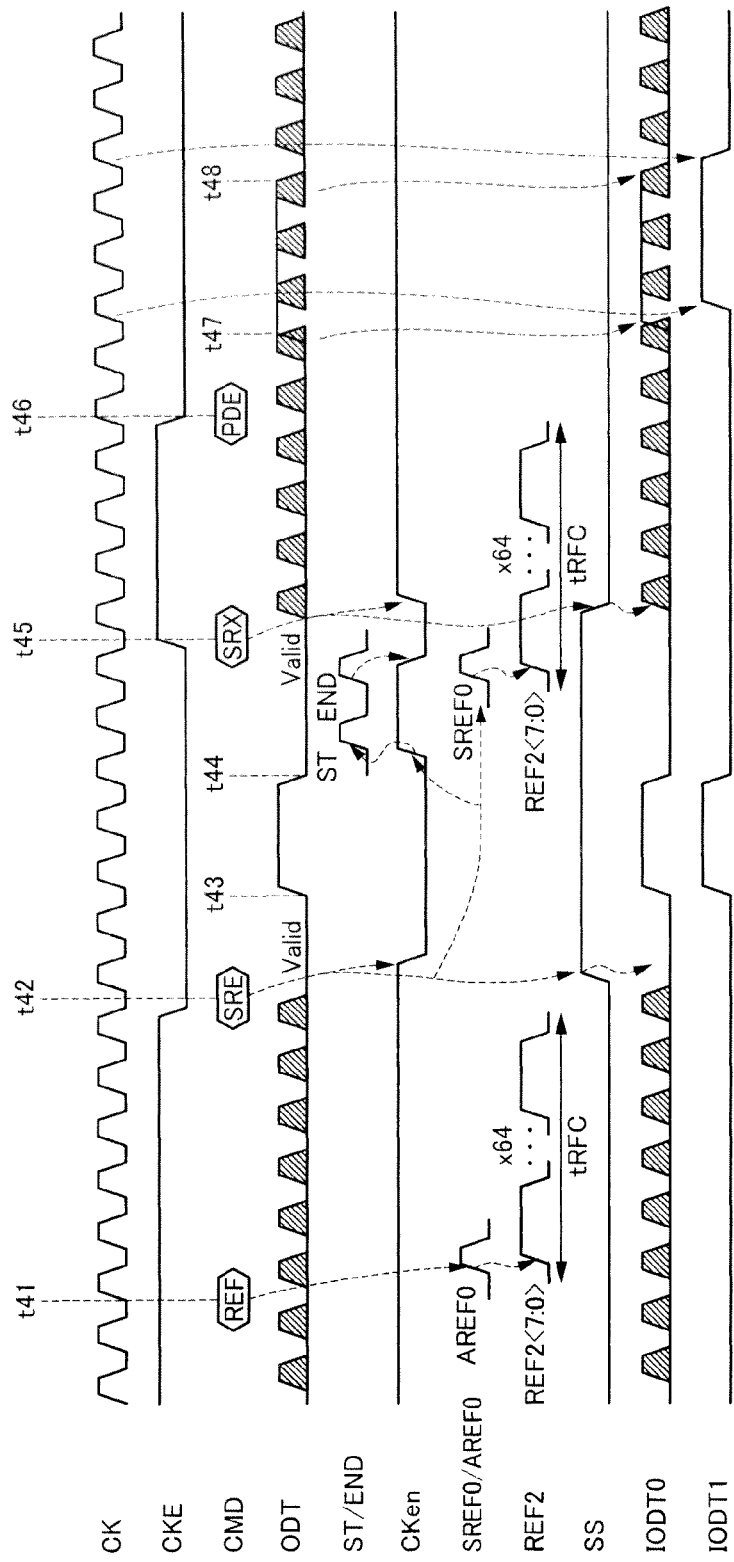
FIG. 16 is a timing chart for explaining an operation of the access control circuit 20b according to the third embodiment.

Turning to FIG. 16, the auto-refresh command REF is issued at a time t41, the self-refresh command SRE is issued at a time t42, the self-refresh exit command SRX is issued at a time t45, and the power-down command PDE is issued at a time t46. Therefore, the semiconductor device 10 is in the self-refresh mode during a period of time from t42 to t45 and the semiconductor device 10 is in a power-down mode during a period after the time t46. In this case, the power-down mode is an operation mode in which input of the first and second commands is inhibited as in the self-refresh mode compliant with the DRAM standards. Major differences of the power-down mode from the self-refresh mode are such that the controller needs to continuously supply the external clock signals CK and CKB to the semiconductor device 10 and can input the impedance control signal CDT in the power-down mode, and that the semiconductor device does not perform an automatic refresh operation (refresh of storage data), causes the DLL circuit to operate, and activates an input circuit (input buffer circuit) connected to an external terminal of the semiconductor device 10 while reducing power consumption of internal circuits of the semiconductor device 10 in the power-down mode and the like. For example, the input buffer circuit 71 connected to the clock terminals 23 and 24 is activated in the power-down mode and is inactivated in the self-refresh mode complying with the DRAM standards. Due to these differences, while a period before a command (the first command) can be input after power-down exit is advantageously shorter in the power-down mode than in the self-refresh mode, power consumption in the self-refresh mode is lower than in the power-down mode. This is particularly because the input buffer circuit 71 and the DLL circuit 200 are activated in the power-down mode.

An operation performed before the semiconductor device enters the self-refresh mode is the same as that in the first embodiment. Therefore, when the auto-refresh command REF is issued at the time t41, the row control circuit 95 supplies the active signals ACT<7:0> eight times to the corresponding banks. This enables eight word lines to be selected one after another and memory cells MC connected to a total of 64 word lines to be refreshed.

When the self-refresh command SRE is issued at the time t42, the semiconductor device enters the self-refresh mode. An operation of the DLL circuit 200 during a period when the semiconductor device has entered the self-refresh mode is as explained above. The update operation of the DLL circuit 200 is performed synchronously with the refresh signal SREF0 periodically input from the oscillator 150. This enables the locked state of the DLL circuit 200 to be maintained also during the period when the semiconductor device has entered the self-refresh mode.

Because the self-state signal SS is changed to a high level when the semiconductor device enters the self-refresh mode, the impedance control signal ODT supplied from the controller is introduced as it is as the impedance control signal IODT1. That is, the impedance control signal IODT1 is introduced independently of (asynchronously with) the external clock signals CK and CKB. In an example shown in FIG. 16, the impedance control signal ODT is activated to a high level during a period of time from t43 to t44 and is internally used as it is as the impedance control signal IODT1. As a result, although the input buffer circuit 71 that receives the external clock signals CK and CKB is only intermittently activated during the period when the semiconductor device has entered the self-refresh mode, the output buffer circuit 30a shown in FIG. 2 can perform an impedance control of the data terminal 31 independently of the external clock signals CK and CKB.

When the self-refresh exit command SRX is issued at the time t45, the input buffer circuit 71 is activated, input of the external clock signals CK and CKB is enabled, and the impedance control signal ODT is input synchronously with the internal clock signal ICLK0.

In this example, the power-down command PDE is issued at the time t46 and the impedance control signal CDT is activated to the high level during a period of time from t47 and t48 in which the semiconductor device has entered the power-down mode. Because the impedance control signal CDT is introduced synchronously with the internal clock signal ICLK0 during this period, the output buffer circuit 30a shown in FIG. 2 can perform an impedance control of the data terminal 31 synchronously with the external clock signals CK and CKB.

As described above, according to the third embodiment, the effect of the first embodiment mentioned above is obtained and also the controller 50 can supply the impedance control signal CDT even during the period when the semiconductor device has entered the self-refresh mode. Even during the period of having entered the self-refresh mode, the semiconductor device can receive the impedance control signal CDT and perform the impedance control. Also the operation of the third embodiment is not specified in the DRAM standards and thus a configuration that enables switching between the operation of the third embodiment and the operation specified in the standards is desirable. That is, it suffices to design a circuit to perform the operation compliant with the DRAM standards in the first operation mode and perform the operation of the third embodiment in the second operation mode. The first operation mode is as already explained. Any of the operations of the first to third embodiments can be easily combined in the second operation mode.

An information processing system according to an embodiment of the present invention is explained next.

Figure 17:
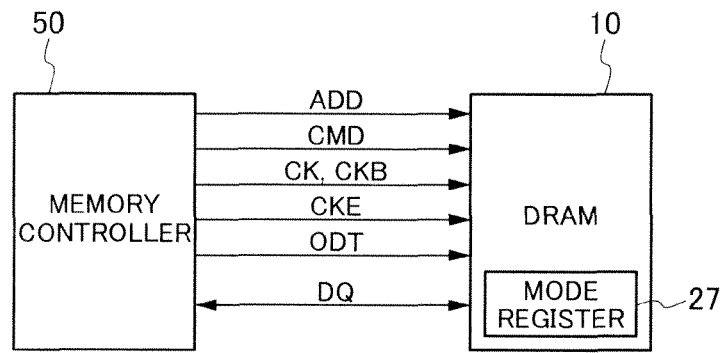
FIG. 17 is a block diagram indicative of a first preferred embodiment of an information processing system according to the present invention.

Turning to FIG. 17, the information processing system has a configuration in which one controller 50 and one semiconductor device (DRAM) 10 are used and are connected with each other. The controller 50 supplies the address signal ADD, the command signal CMD, the external clock signals CK and CKB, the clock enable signal CKE, and the impedance control signal CDT to the semiconductor device 10. The controller 50 sets the semiconductor device 10 to the first or second operation mode. When having set the semiconductor device 10 to the first operation mode, the controller 50 issues the command signal CMD and the like according to the DRAM standards. On the other hand, when having set the semiconductor device 10 to the second operation mode, the controller 50 issues the command signal CMD and the like at a timing not compliant with the DRAM standards, thereby realizing the operations explained in the first to third embodiments.

Selection of an operation mode can be performed by setting the operation mode in a mode register 27 included in the semiconductor device 10. Setting to the mode register 27 is performed by a method of issuing a mode-register set command (MRS) and inputting an operation mode to be set through the address terminal 21. According to this method, the first or second operation mode is selected at the time of initialization of the semiconductor device 10.

However, selection of an operation mode is not limited thereto and the first or second operation mode can be selected by a so-called on-the-fly method. That is, an additional signal that specifies the first or second operation mode can be issued using the address terminal 21 or the data terminal 31 when the self-refresh command SRE is issued, thereby selecting the first or second operation mode each time the semiconductor device enters the self-refresh mode.

Figure 18:
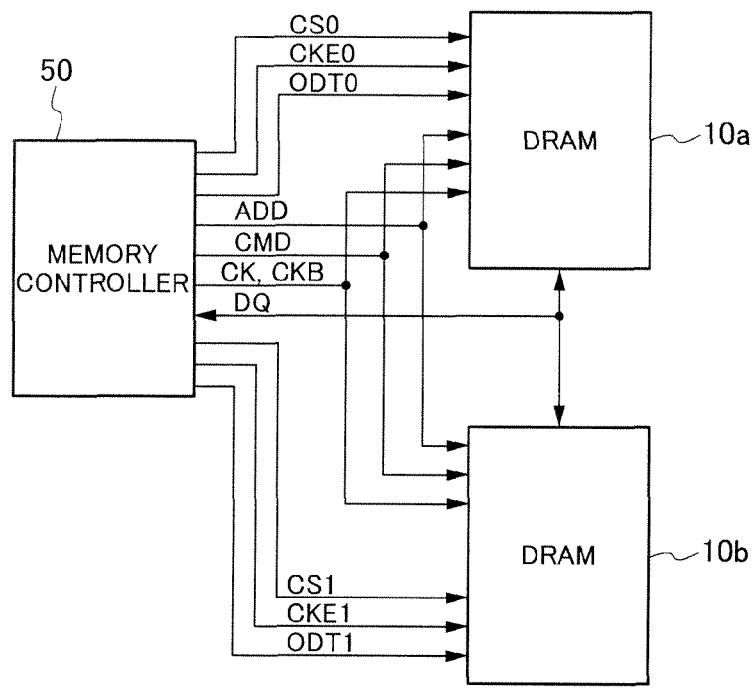
FIG. 18 is a block diagram indicative of a second preferred embodiment of an information processing system according to the present invention.

Turning to FIG. 18, two semiconductor devices (DRAMs) 10a and 10b are connected to one controller 50. The address signal ADD, the command signal CMD, the external clock signals CK and CKB from the controller 50 are commonly supplied to the two semiconductor devices 10a and 10b. The data terminals 31 of the semiconductor devices 10a and 10b are also commonly connected to the controller 50. On the other hand, the clock enable signal CKE and the impedance control signal ODT are separately supplied to the semiconductor devices 10a and 10b. That is, a clock enable signal CKE0 and an impedance control signal ODT0 are supplied to the semiconductor device 10a and a clock enable signal CKE1 and an impedance control signal ODT1 are supplied to the semiconductor device 10b. Selection of the semiconductor device 10a or 10b is performed by a chip select signal CS0 or CS1. That is, the command signal CMD or the like issued from the controller 50 becomes valid only for the semiconductor device 10a or 10b to which the chip select signal is activated.

Figure 19:
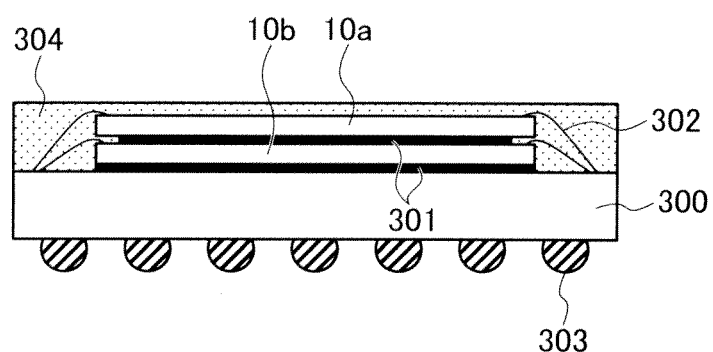
FIG. 19 is a schematic cross-sectional view for explaining a configuration of a dual-die package DDP, which is a package having two semiconductor devices 10a and 10b.

Turning to FIG. 19, the dual-die package DDP having a configuration in which the two semiconductor devices 10a and 10b are stacked on a package substrate 300 is shown. Between the semiconductor devices 10a and 10b and between the semiconductor device 10b and the package substrate 300, an adhesive 301 is interposed, which fixes the semiconductor devices 10a and 10b and the semiconductor device 10b and the package substrate 300 to each other. The semiconductor devices 10a and 10b and the package substrate 300 are connected with a bonding wire 302, which electrically connects the semiconductor devices 10a and 10b to external terminals 303 through an internal wire (not shown) provided in the package substrate 300. A sealing resin 304 is provided on the package substrate 300 to protect the semiconductor devices 10a and 10b and the bonding wire 302.

Figure 20:
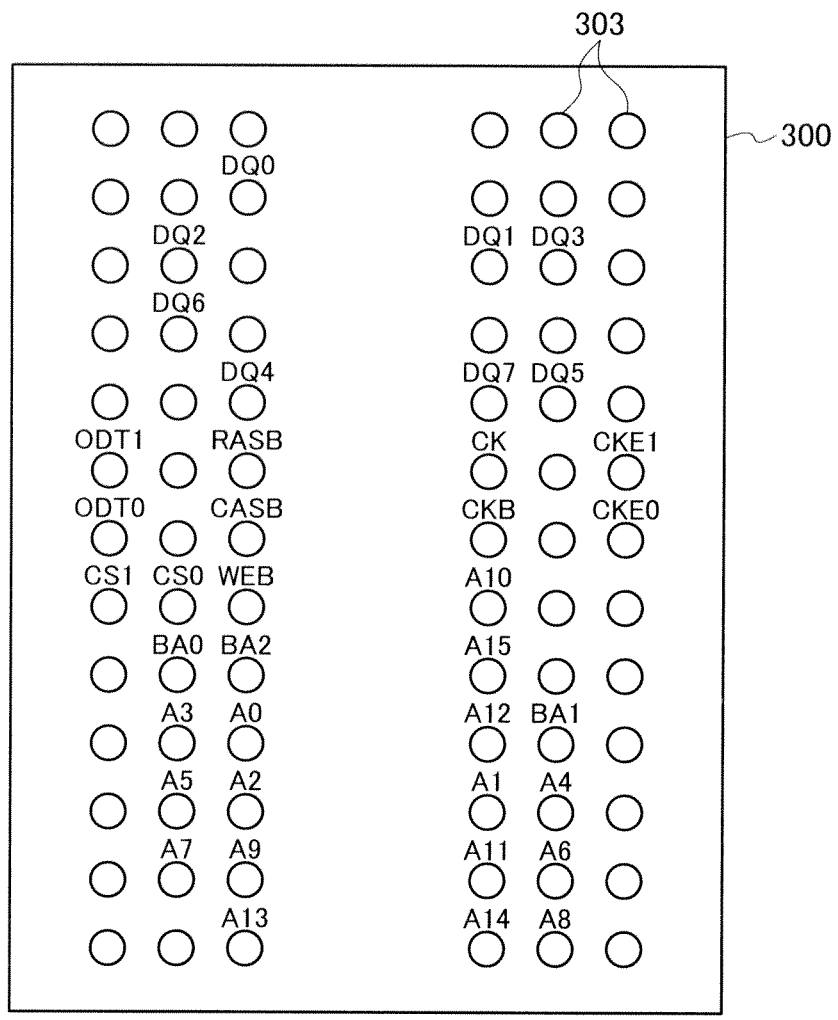
FIG. 20 is a schematic plan view showing an example of a layout of the external terminals 303 provided on the dual-die package DDP.

Turning to FIG. 20, the external terminals 303 are laid out in a matrix on the dual-die packaged DDP. Among these terminals, those related to the address signal ADD, the command signal CMD, the external clock signals CK and CKB, and data DQ are provided commonly for the semiconductor devices 10a and 10b. On the other hand, those related to the clock enable signal CKE, the impedance control signal CDT, and the chip select signal CS are provided separately for the semiconductor devices 10a and 10b. Therefore, even when only one of the semiconductor devices 10a and 10b has entered the self-refresh mode, the external clock signals CK and CKB are continuously supplied to both of the semiconductor devices 10a and 10b. Accordingly, it can be said that this configuration has high compatibility with the second operation mode mentioned above.

For example, when the semiconductor device 10a has entered the self-refresh mode and the semiconductor device 10b has not entered the self-refresh mode, the DLL circuit 200 and the input buffer circuit 71 of the semiconductor device 10a are intermittently activated during the self-refresh mode by utilizing the external clock signals CK and CKB continuously supplied also to the semiconductor device 10a, so that the locked state of the DLL circuit 200 can be maintained. When it is configured to enable input of the impedance control signal CDT even in the self-refresh mode as in the third embodiment, the impedance control signal ODT0 or ODT1 can be set to a high level, thereby performing an impedance control of the output buffer circuit 30a, even when both of the semiconductor devices 10a and 10b have entered the self-refresh mode.

Figure 21:
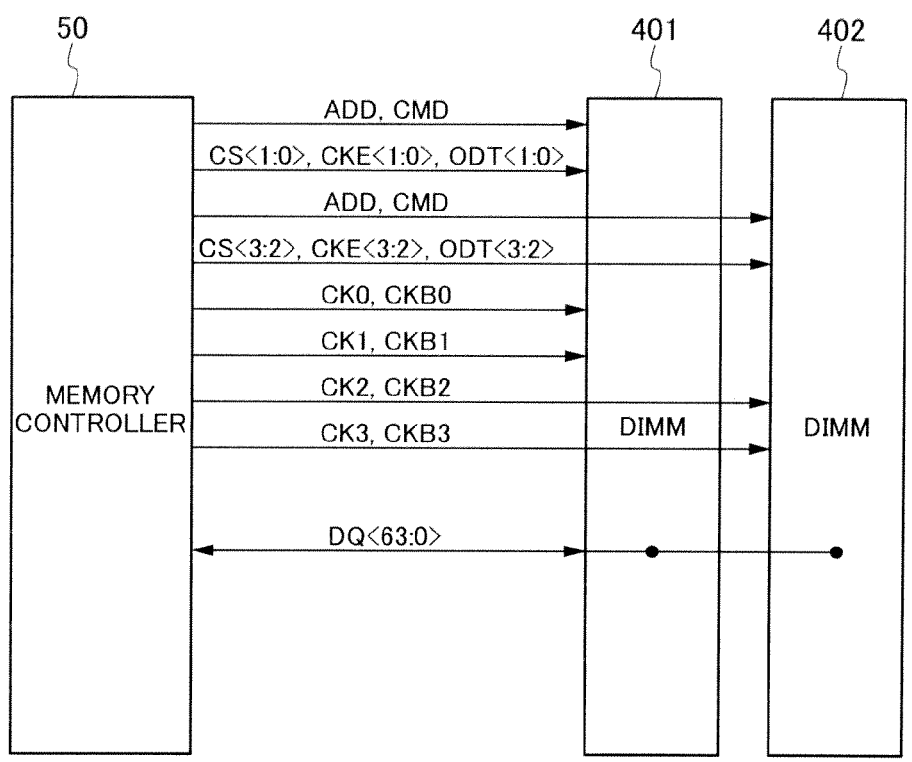
FIG. 21 is a block diagram indicative of the third embodiment of an information processing system according to the present invention.

Turning to FIG. 21, two DIMMs (Dual Inline Memory Modules) 401 and 402 are connected to one controller 50. For example, 16 semiconductor devices (DRAMs) 10 are mounted on each of the DIMMs 401 and 402. Each of the DIMMs 401 and 402 has a two-rank configuration and accordingly there are four ranks in total. One rank is composed of eight semiconductor devices 10, for example, which are arranged on one of surfaces of a module substrate although not particularly limited thereto. A rank is exclusively selected by chip select signals CS0 to CS3.

The address signal ADD and the command signal CMD from the controller 50 are supplied to each of the DIMMs 401 and 402. On the other hand, the external clock signals CK and CKB are supplied to each rank. The data terminals 31 are commonly supplied to the controller 50 in the four ranks.

Turning to FIGS. 22A to 22C, when a write operation is performed for the DIMM 401, one of the ranks (the rank 1 in FIG. 22A) in the DIMM 401 is terminated to 120 ohms (Ω) and one of the ranks (the rank 2 in FIG. 22A) in the DIMM 402 is terminated to 30Ω as shown in FIG. 22A. When a write operation is performed for the DIMM 402, one of the ranks (the rank 2 in FIG. 22B) in the DIMM 401 is terminated to 30Ω and one of the ranks (the rank 1 in FIG. 22B) in the DIMM 402 is terminated to 120Ω as shown in FIG. 22B.

As shown in FIG. 22C, when a read operation is performed for the DIMM 401, one of the ranks (the rank 2 in FIG. 22C) in the DIMM 402 is terminated to 30Ω. When a read operation is performed for the DIMM 402, one of the ranks (the rank 2 in FIG. 22D) in the DIMM 401 is terminated to 30Ω as shown in FIG. 22D.

In this example, even when one of the DIMMs 401 and 402 is to be accessed, the other one of the DIMMs 401 and 402 needs to be functioned as a terminating resistor. Such a control is particularly required when an operating frequency is high. When this control is required, ranks that do not need to be accessed can be entered into the self-refresh mode in which power consumption is much lower than in the power-down mode by using the semiconductor device according to the third embodiment. That is, in the semiconductor device according to the third embodiment, the impedance control signal ODT can be input even when the semiconductor devices has entered the self-refresh mode and thus a desired terminating resistance can be obtained by outputting the impedance control signal ODT from the controller 50 synchronously with a read operation or a write operation for another rank.

It is apparent that the present invention is not limited to the above embodiments, but may be modified and changed without departing from the scope and spirit of the invention.

For example, while the refresh operation and the update operation of the DLL circuit 200 are performed using the refresh signal SREF0 output from the oscillator 150 as a trigger in the above embodiments, a trigger for performing the refresh operation during the self-refresh mode and a trigger for performing the update operation of the DLL circuit 200 do not need to be the same. Therefore, an oscillator for the refresh operation and an oscillator for the update operation of the DLL circuit 200 can be provided separately. Alternatively, it can be configured to frequency-divide an output of an oscillator for the refresh operation to perform the update operation of the DLL circuit 200 once for a plurality of the refresh operations.

Furthermore, a PLL circuit can be used instead of the DLL circuit. The controller 50 can have functions other than that of controlling a memory.

The technical concept of the present invention can be applied to a semiconductor device having various functional chips, a controller thereof, and a system thereof. Furthermore, the configuration of each circuit disclosed in the drawings is not limited to the circuit form disclosed in the above embodiments.

The technical concept of the system of the present invention may be applied to various semiconductor devices. For example, the present invention can be applied to a general system including a CPU (Central Processing Unit), an MCU (Micro Control Unit), a DSP (Digital Signal Processor), an ASIC (Application Specific Integrated Circuit), and an ASSP (Application Specific Standard Product), a Memory and the like. An SOC (System on Chip), an MCP (Multi Chip Package), and a POP (Package on Package) and so on, and a module on which they are applied are pointed to as examples of types of system to which the present invention is applied. The present invention can be applied to the system that has these arbitrary product form and package form.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

In addition, while not specifically claimed in the claim section, the applicant reserves the right to include in the claim section of the application at any appropriate time the following controllers, control methods thereof, control methods of an information processing system, and semiconductor devices:

A1. A controller comprising:
a clock signal issuing unit that issues a clock signal having a predetermined frequency; and
a command issuing unit that issues at least a self-refresh command that causes a semiconductor device to enter a self-refresh mode in which a refresh operation of storage data is periodically performed asynchronously with the clock signal, wherein
when the controller is in a first operation mode, the clock signal issuing unit stops issuing the clock signal or changes a frequency thereof in at least a part of period while the semiconductor device is in the self-refresh mode, and
when the controller is in a second operation mode, the clock signal issuing unit continuously issues the clock signal without changing the frequency while the semiconductor device is in the self-refresh mode.

A2. The controller as A1, wherein
the command issuing unit further issues a self-refresh exit command that causes the semiconductor device to exit the self-refresh mode, a first command that causes the semiconductor device to perform an access operation to the storage data, and a second command that causes the semiconductor device to output the storage data from a data terminal included in the semiconductor device or to control an impedance of the data terminal, the command issuing unit, in the first operation mode, issues the second command after elapse of a first period at earliest from issuing the self-refresh exit command, and
the command issuing unit, in the second operation mode, issues the second command after elapse of a second period that is shorter than the first period at earliest from issuing the self-refresh exit command.

A3. The controller as A2, wherein the first period is longer than a maximum period required to lock a DLL circuit included in the semiconductor device after the controller issues a reset command to the semiconductor device.

A4. The controller as A3, wherein the second period is shorter than the maximum period.

A5. The controller as A2, wherein
the command issuing unit, in the first operation mode, issues the first command after elapse of a third period at earliest from issuing the self-refresh exit command, and
the command issuing unit, in the second operation mode, issues the first command after elapse of a fourth period shorter than the third period at earliest from issuing the self-refresh exit command.

A6. The controller as A5, wherein the third period is longer than a refresh period required to complete the refresh operation in the semiconductor device after the controller issues an auto-refresh command that causes the semiconductor device to perform the refresh operation of storage data in synchronism with the clock signal.

A7. The controller as A6, wherein the fourth period is shorter than the refresh period.

A8. The controller as any one of A2 to A7, wherein
the second command is an impedance control signal that controls an impedance of the data terminal, and
when the controller is in a second operation mode, the command issuing unit issues the impedance control signal in at least a part of period while the semiconductor device is in the self-refresh mode.

A9. The controller as A8, wherein when the controller is in a first operation mode, the command issuing unit does not issue the impedance control signal while the semiconductor device is in the self-refresh mode.

A10. The controller as A8 or A9, wherein the command issuing unit issues the impedance control signal while the semiconductor device is not in the self-refresh mode.

A11. The controller as any one of A1 to A10, wherein the command issuing unit further issues a mode-register set command that sets the semiconductor device to the first or second operation mode.

A12. The controller as any one of A1 to A10, further comprising a data processor that processes the storage data transmitted to or received from the semiconductor device through a data line, and an address processor that specifies an address of the storage data,
wherein the data processor or the address processor issues an additional signal that specifies the first or second operation mode along with the self-refresh command.

A13. A control method of a controller, the method comprising:
issuing a clock signal having a predetermined frequency;
setting a semiconductor device to a first or second operation mode, the semiconductor device having a self-refresh mode in which a refresh operation of storage data is automatically performed;
issuing a self-refresh command that causes the semiconductor device to enter the self-refresh mode;

stopping the clock signal or changing the predetermined frequency thereof after issuing the self-refresh command when the semiconductor device is in the first operation mode; and continuously issuing the clock signal without changing the predetermined frequency regardless of whether the self-refresh command has been issued when the semiconductor device is in the second operation mode.

A14. The control method of a controller as A13, wherein the semiconductor device periodically performs the refresh operation of the storage data asynchronously with the clock signal in the self-refresh mode, and the controller continuously issues the clock signal with the predetermined frequency while the semiconductor device is not in the self-refresh mode.

A15. The control method of a controller as A13 or A14, the method further comprising:

issuing a self-refresh exit command that causes the semiconductor device to exit the self-refresh command;

issuing a first command that causes the semiconductor device to perform an access operation to the storage data while the semiconductor device is not in the self-refresh mode;

issuing a second command that causes the semiconductor device to output the storage data through a data terminal or to control an impedance of the data terminal while the semiconductor device is not in the self-refresh mode;

issuing the second command after elapse of a first period at earliest from issuing the self-refresh exit command while the semiconductor device is in the first operation mode; and issuing the second command after elapse of a second period that is shorter than the first period at earliest from issuing the self-refresh exit command while the semiconductor device is in the second operation mode.

A16. The control method of a controller as A15, wherein the first period is longer than a maximum period required to lock a DLL circuit included in the semiconductor device after the controller issues a reset command to the semiconductor device.

A17. The control method of a controller as A16, wherein the second period is shorter than the maximum period.

A18. The control method of a controller as any one of A15 to A17, the method further comprising:

issuing the first command after elapse of a third period at earliest from issuing the self-refresh exit command while the semiconductor device is in the first operation mode; and issuing the first command after elapse of a fourth period that is shorter than the third period at earliest from issuing the self-refresh exit command while the semiconductor device is in the second operation mode.

A19. The control method of a controller as A18, wherein the third period is longer than a refresh period required to complete a refresh operation in the semiconductor device after the controller issues an auto-refresh command that causes the semiconductor device to perform the refresh operation on the storage data synchronously with the clock signal.

A20. The control method of a controller as A19, wherein the fourth period is shorter than the refresh period.

A21. The control method of a controller as any one of A13 to A20, the method further comprising:

issuing an impedance control signal that controls an impedance of a data terminal provided in the semiconductor device while the semiconductor device is not in the self-refresh mode; and issuing the impedance control signal while the semiconductor device is in the self-refresh mode and in the second operation mode, wherein the controller does not issue the impedance control signal during a period while the semiconductor device is in the self-refresh mode and in the first operation mode.

A22. The control method of a controller as one any of A13 to A21, the method further comprising issuing mode-register set command that sets the semiconductor device to the first or second operation mode.

A23. The control method of a controller as any one of A13 to A21, the method further comprising issuing an additional signal that sets the semiconductor device to the first or second operation mode along with the self-refresh command.

A24. A control method of an information processing system having a controller and a semiconductor device, wherein the controller setting the semiconductor device to a first or second operation mode;

issuing a clock signal having a predetermined frequency to the semiconductor device;

issuing a self-refresh command to the semiconductor device;

stopping the clock signal or changes the predetermined frequency thereof after issuing the self-refresh command when the semiconductor device is in the first operation mode; and continuously issuing the clock signal with the predetermined frequency regardless of whether the self-refresh command is issued when the semiconductor device is in the second operation mode, and the semiconductor device receiving the clock signal;

entering a self-refresh mode in response to the self-refresh command to periodically perform an refresh operation on storage data asynchronously with the clock signal while the semiconductor device is in the self-refresh mode;

inactivating, in the first operation mode, a DLL circuit that generates an internal clock signal that is phase-controlled based on the clock signal in response to the self-refresh command and resetting information related to a delay amount of the DLL circuit; and intermittently activating, in the second operation mode, the DLL circuit and maintaining the information updated at each activation in response to the self-refresh command.

A25. The control method of an information processing system as A24, the controller further issuing a self-refresh exit command to the semiconductor device that causes the semiconductor device to exit the self-refresh mode;

reissuing the clock signal in association with the self-refresh exit command in the first operation mode; and continuously issuing the clock signal with the predetermined frequency regardless of the self-refresh exit command in the second operation mode, and the semiconductor device further reactivating the DLL circuit in response to the self-refresh exit command in the first operation mode; and maintaining the information regardless of the self-refresh exit command in the second operation mode.

A26. The control method of an information processing system as A24 or A25,
the controller further
issuing a first command to the semiconductor device to causes the semiconductor device to perform an access operation to the storage data;
issuing a second command after elapse of a first period at earliest from issuing the self-refresh exit command in the first operation mode; and
issuing the second command after elapse of a second period that is shorter than the first period at earliest from issuing the self-refresh exit command in the second operation mode, and
the semiconductor device outputting the storage data through a data terminal of the semiconductor device or controlling an impedance of the data terminal in response to the second command.

A27. The control method of an information processing system as A26, wherein the first period is longer than a maximum period required to lock the DLL circuit included in the semiconductor device after the controller issues a reset command to the semiconductor device.

A28. The control method of an information processing system as A27, wherein the second period is shorter than the maximum period.

A29. The control method of an information processing system as any one of A26 to A28, the controller further
issuing the first command after elapse of a third period at earliest from issuing the self-refresh exit command in the first operation mode; and
issuing the first command after elapse of a fourth period shorter than the third period at earliest from issuing the self-refresh exit command in the second operation mode.

A30. The control method of an information processing system as A29, wherein
the controller further issues an auto-refresh command to the semiconductor device,
the semiconductor device further performs the refresh operation on the storage data in response to the auto-refresh command, and
the third period is longer than a refresh period required to complete the refresh operation from an issuance of the auto-refresh command.

A31. The control method of an information processing system as A30, wherein the fourth period is shorter than the refresh period.

A32. The control method of an information processing system as any one of A24 to A31, wherein
the controller does not issue an impedance control signal that controls an impedance of a data terminal provided in the semiconductor device to output the storage data during the self-refresh mode in the first operation mode,
the controller issues the impedance control signal during the self-refresh mode in the second operation mode, and
the semiconductor device further receives the impedance control signal and controls an impedance of the data terminal.

A33. The control method of an information processing system as A32, wherein
the controller issues the impedance control signal asynchronously with the clock signal, and
the semiconductor device controls an impedance of the data terminal asynchronously with the clock signal.

A34. The control method of an information processing system as A33, wherein
the controller issues the impedance control signal synchronously with the clock signal during a period other than the self-refresh mode, and
the semiconductor device controls an impedance of the data terminal synchronously with the clock signal.

A35. The control method of an information processing system as any one of A24 to A34, wherein
the controller further issues a mode-register set command that sets the semiconductor device to the first or second operation mode, and
the semiconductor device further sets the first or second operation mode in response to the mode-register set command.

A36. The control method of an information processing system as any one of A24 to A34, wherein
the controller further issues an additional signal that sets the semiconductor device to the first or second operation mode along with the self-refresh command, and
the semiconductor device further sets the first or second operation mode in response to the self-refresh command and the additional signal.

A37. A semiconductor device comprising:
a first input buffer circuit to which an external clock signal having a predetermined frequency is supplied from outside;
a DLL circuit that generates an internal clock signal that is phase-controlled based on an output signal from the first input buffer circuit;
a memory cell array that has a plurality of memory cells requiring an refresh operation in order to retain of storage data therein;
an output buffer circuit that outputs the storage data read from the memory cell array to outside through a data terminal synchronously with the internal clock signal; and
an access control circuit, wherein
the access control circuit performs an access operation to the memory cell array in response to a first command,
the access control circuit outputs the storage data from the data terminal or controls an impedance of the data terminal synchronously with the external clock signal or the internal clock signal in response to a second command,
the access control circuit enters a self-refresh mode in which the refresh operation on the storage data is periodically performed asynchronously with the external clock signal in response to a self-refresh command,
the access control circuit exits the self-refresh mode in response to a self-refresh exit command, and
the access control circuit intermittently activates the first input buffer circuit and the DLL circuit in conjunction with each other during the self-refresh mode.

A38. The semiconductor device as A37, further comprising a second input buffer circuit to which an impedance control signal that controls an impedance of the data terminal is supplied from outside,
wherein the access control circuit further inactivates the second input buffer circuit during the self-refresh mode.

A39. The semiconductor device as A37 or A38, wherein
the access control circuit further intermittently outputs an update start signal that activates the DLL circuit in response to the self-refresh command,
the DLL circuit outputs an update end signal to the access control circuit in response to acquisition of a desired phase of the internal clock signal, and
the access control circuit activates the first input buffer circuit synchronously with the update start signal and inactivates the first input buffer circuit synchronously with the update end signal.

A40. The semiconductor device as any one of A37 to A39, further comprising a third input buffer circuit to which a clock enable signal indicating whether the external clock signal is valid is supplied from outside, wherein the self-refresh exit command is indicated by the clock enable signal.

A41. The semiconductor device as A40, wherein the self-refresh command is indicated by a signal from a command terminal through which the first and second commands are supplied, and the clock enable signal.

A42. The semiconductor device as any one of A37 to A41, wherein the semiconductor device having first and second operation modes, the access control circuit activates the DLL circuit in response to the self-refresh exit command without intermittently activating the DLL circuit during the self-refresh mode, in the first operation mode, and the access control circuit intermittently activates the DLL circuit during the self-refresh mode and does not perform activation of the DLL circuit in response to the self-refresh exit command, in the second operation mode.

A43. The semiconductor device as anyone of A37 to A42, wherein the semiconductor device having first and second operation modes, the access control circuit periodically performs the refresh operation on n memory cells included in the memory cell array during the self-refresh mode, in the first operation mode, and the access control circuit performs the refresh operation on m memory cells, m being smaller than n, included in the memory cell array during the self-refresh mode, while changing addresses for each first cycle asynchronous with the external clock signal having the predetermined frequency, in the second operation mode.

A44. The semiconductor device as A43, wherein the access control circuit performs the refresh operation on the n memory cells included in the memory cell array in response to an auto-refresh command supplied from outside, in both of the first and second operation modes.

A45. The semiconductor device as any one of A37 to A44, further comprising a second input buffer circuit to which an impedance control signal that controls an impedance of the data terminal is supplied from outside, wherein the access control circuit inactivates the second input buffer circuit during the self-refresh mode in the first operation mode, and the access control circuit activates the second input buffer circuit during the self-refresh mode in the second operation mode.

A46. The semiconductor device as A45, wherein the access control circuit controls an impedance of the data terminal asynchronously with the external clock signal or the internal clock signal in response to issuance of the impedance control signal during the self-refresh mode in the second operation mode.

A47. The semiconductor device as A45 or A46, wherein the access control circuit controls an impedance of the data terminal synchronously with the external clock signal or the internal clock signal in response to issuance of the impedance control signal during a period while the semiconductor device in not in the self-refresh mode, in both of the first and second operation modes.

A48. The semiconductor device as any one of A42 to A47, wherein the semiconductor device is set to the first or second operation mode according to a mode-register set command supplied from outside.

A49. The semiconductor device as any one of A42 to A47, wherein the semiconductor device is set in the first or second operation mode according to an additional signal supplied from outside along with the self-refresh command.

What is claimed is:
1. An information processing system comprising:
a first device including a memory cell array that holds storage data, an input buffer circuit to which an external clock signal having a predetermined frequency is supplied, and a DLL circuit that generates an internal clock signal that is phase-controlled based on the external clock signal, the first device having a self-refresh mode in which a refresh operation of the storage data is periodically performed asynchronously with the external clock signal; and
a second device issuing the external clock signal, a self-refresh command that causes the first device to enter the self-refresh mode, and a self-refresh exit command that causes the first device to exit the self-refresh mode, wherein
the second device continuously issues the external clock signal to the first device while the first device is in the self-refresh mode, and
the first device intermittently activates the input buffer circuit and the DLL circuit in conjunction with each other while the first device is in the self-refresh mode.

2. The information processing system as claimed in claim 1, wherein
each of the first and second devices has first and second operation modes,
the second device, in the first operation mode, stops issuing the external clock signal or changes the frequency thereof while the first device is in the self-refresh mode, and
the second device, in the second operation mode, continuously issues the external clock signal having the predetermined frequency without stopping the external clock signal while the first device is in the self-refresh mode.

3. The information processing system as claimed in claim 2, wherein the first device activates the DLL circuit when the self-refresh exit command is issued in the first operation mode.

4. The information processing system as claimed in claim 3, wherein
the first device further includes a data terminal through which the storage data is output to the second device,
the second device further issues a first command that causes the first device to perform an access operation to the memory cell array and a second command that causes the first device to output the storage data through the data terminal in synchronism with the internal clock signal or to control an impedance of the data terminal in synchronism with the internal clock signal,
the second device, in the first operation mode, issues the second command after elapse of a first period at earliest from issuing the self-refresh exit command, and
the second device, in the second operation mode, issues the second command after elapse of a second period that is shorter than the first period at earliest from issuing the self-refresh exit command.

5. The information processing system as claimed in claim 2, wherein
the second device further issues a mode-register set command, and
the first device is set to the first or second operation mode according to the mode-register set command.

6. The information processing system as claimed in claim 2, wherein
the second device further issues an additional signal that specifies the first or second operation mode along with the self-refresh command, and
the first device is set to the first or second operation mode according to the additional signal.

7. The information processing system as claimed in claim 2, wherein
the first device further includes a data terminal through which the storage data is output to the second device,
the first device, in the first operation mode, periodically performs the refresh operation on n memory cells included in the memory cell array while the first device is in the self-refresh mode, and
the first device, in the second operation mode, periodically performs the refresh operation on m memory cells included in the memory cell array asynchronous with the external clock signal while the first device is in the self-refresh mode, where m is smaller than n.

8. The information processing system as claimed in claim 7, wherein
the second device further issues a first command that causes the first device to perform an access operation to the memory cell array and a second command that causes the first device to output the storage data through the data terminal in synchronism with the internal clock signal or to control an impedance of the data terminal in synchronism with the internal clock signal,
the second device, in the first operation mode, issues the first command after elapse of a third period at earliest from issuing the self-refresh exit command, and
the second device, in the second operation mode, issues the first command after elapse of a fourth period that is shorter than the third period at earliest from issuing the self-refresh exit command.

9. The information processing system as claimed in claim 8, wherein
the second device further issues an auto-refresh command, and
the first device, in either the first or second operation modes, performs the refresh operation on the n memory cells included in the memory cell array when the auto-refresh command is issued.

10. The information processing system as claimed in claim 1, wherein
the first device further includes a data terminal through which the storage data is output to the second device, and
the second device further issues an impedance control signal that controls an impedance of the data terminal while the first device is in the self-refresh mode.

11. The information processing system as claimed in claim 10, wherein
the second device issues the impedance control signal asynchronously with the external clock signal while the first device is in the self-refresh mode, and
the first device controls an impedance of the data terminal asynchronously with the external clock signal or the internal clock signal when the impedance control signal is issued while the first device is in the self-refresh mode.

12. The information processing system as claimed in claim 10, wherein
the second device issues the impedance control signal synchronously with the external clock signal while the first device is in other than the self-refresh mode, and
the first device controls an impedance of the data terminal synchronously with the external clock signal while the first device is in other than the self-refresh mode.

13. The information processing system as claimed in claim 10, wherein
each of the first and second devices has first and second operation modes, and
the second device, in the second operation mode, issues the impedance control signal while the first device is in the self-refresh mode.

14. The information processing system as claimed in claim 13, wherein the second device, in the first operation mode, does not issue the impedance control signal while the first device is in the self-refresh mode.

15. The information processing system as claimed in claim 1, further comprising a third device having substantially the same configuration as the first device, wherein
each of the first and third devices includes a clock terminal to which the external clock signal is supplied,
the clock terminals included in the first and third devices are commonly connected with each other, and
the second device supplies the external clock signal commonly to the first and third devices.

16. The information processing system as claimed in claim 1, further comprising a third device having substantially the same configuration as the first device, wherein
each of the first and third devices includes:
a clock terminal to which the external clock signal is supplied;
a clock enable terminal to which a clock enable signal indicating whether the external clock signal is valid is supplied;
a data terminal through which the storage data is output;
an ODT terminal to which an impedance control signal that controls an impedance of the data terminal is supplied; and
a chip select terminal to which a chip select signal that selects an associated one of the first and third devices is supplied,
the clock terminals included in the first and third devices are commonly connected with each other,
the data terminals included in the first and third devices are commonly connected with each other,
the clock enable terminals included in the first and third devices are electrically independent of each other,
the ODT terminals included in the first and third devices are electrically independent of each other,
the chip select terminals included in the first and third devices are electrically independent of each other,
the second device supplies the external clock signal commonly to the first and third devices, and
the second device supplies different one of the clock enable signals, different one of the impedance control signals, different one of the chip select signals to the first and third devices, respectively.

17. The information processing system as claimed in claim 1, further comprising a third device having substantially the same configuration as the first device, wherein
each of the first and third devices includes:
a clock terminal to which the external clock signal is supplied;

a clock enable terminal to which a clock enable signal indicating whether the external clock signal is valid is supplied;

a data terminal through which the storage data is output;

an ODT terminal to which an impedance control signal that controls an impedance of the data terminal is supplied; and a chip select terminal to which a chip select signal that selects an associated one of the first and third devices is supplied, the data terminals included in the first and third devices are commonly connected with each other, the clock terminals included in the first and third devices are electrically independent of each other the clock enable terminals included in the first and third devices are electrically independent of each other, the ODT terminals included in the first and third devices are electrically independent of each other, the chip select terminals included in the first and third devices are electrically independent of each other, and the second device supplies different one of the external clock signals, different one of the clock enable signals, different one of the impedance control signals, and different one of the chip select signals to the first and third devices, respectively.

18. The information processing system as claimed in claim 16, wherein the self-refresh exit command is expressed by using the clock enable signal.

19. The information processing system as claimed in claim 16, wherein the first and third devices are mounted on different module substrates.

20. The information processing system as claimed in claim 1, wherein the first device further includes a data terminal through which the storage data is output to the second device.

* * * * *